United States Patent
Isurugi et al.

(10) Patent No.: US 9,914,243 B2
(45) Date of Patent: Mar. 13, 2018

(54) MOLD BASE MATERIAL, PRODUCTION METHOD FOR MOLD BASE MATERIAL, MOLD PRODUCTION METHOD, AND MOLD

(71) Applicants: Sharp Kabushiki Kaisha, Osaka-shi, Osaka (JP); GEOMATEC CO., LTD., Kanagawa (JP)

(72) Inventors: Akinobu Isurugi, Osaka (JP); Kiyoshi Minoura, Osaka (JP); Hiroyuki Sugawara, Miyagi (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 470 days.

(21) Appl. No.: 14/405,450

(22) PCT Filed: Jun. 3, 2013

(86) PCT No.: PCT/JP2013/065323
§ 371 (c)(1),
(2) Date: Dec. 4, 2014

(87) PCT Pub. No.: WO2013/183576
PCT Pub. Date: Dec. 12, 2013

(65) Prior Publication Data
US 2015/0140154 A1    May 21, 2015

(30) Foreign Application Priority Data
Jun. 6, 2012 (JP) ................. 2012-128704

(51) Int. Cl.
*B29C 33/38* (2006.01)
*C25D 11/12* (2006.01)
(Continued)

(52) U.S. Cl.
CPC .......... *B29C 33/3814* (2013.01); *B29C 33/56* (2013.01); *C23C 14/0617* (2013.01);
(Continued)

(58) Field of Classification Search
CPC ................................................ B29C 33/3814
(Continued)

(56) References Cited

U.S. PATENT DOCUMENTS 6,359,735 B1   3/2002   Gombert et al.
2002/0022134 A1   2/2002   Fujino et al.
(Continued)

FOREIGN PATENT DOCUMENTS

CN     1340201 A    3/2002
JP    2001517319 A   10/2001
(Continued)

OTHER PUBLICATIONS

International Search Report PCT/ISA/210 for International Application No. PCT/JP2013/065323 dated Jun. 3, 2013.

*Primary Examiner* — Joseph S Del Sole
*Assistant Examiner* — Thukhanh T Nguyen
(74) *Attorney, Agent, or Firm* — Harness, Dickey & Pierce, P.L.C.

(57) ABSTRACT

A mold base of an embodiment is a mold base for use in manufacture of a mold that has a porous alumina layer over its surface, including: a base; and an aluminum alloy layer provided on the base, wherein the aluminum alloy layer contains aluminum, a non-aluminum metal element, and nitrogen. The aluminum alloy layer of the mold base of an embodiment of the present invention has high specularity.

19 Claims, 28 Drawing Sheets

(51) Int. Cl.
    *C25D 11/18*     (2006.01)
    *G02B 1/118*     (2015.01)
    *C23C 14/08*     (2006.01)
    *C23C 14/18*     (2006.01)
    *C23C 14/58*     (2006.01)
    *C23C 14/06*     (2006.01)
    *B29C 33/56*     (2006.01)
    *B29C 59/04*     (2006.01)
    *B29C 35/08*     (2006.01)
    *B29C 33/42*     (2006.01)
    *B29K 505/02*     (2006.01)
    *B29L 31/00*     (2006.01)

(52) U.S. Cl.
    CPC .......... *C23C 14/083* (2013.01); *C23C 14/185* (2013.01); *C23C 14/5853* (2013.01); *C23C 14/5873* (2013.01); *C25D 11/12* (2013.01); *C25D 11/18* (2013.01); *G02B 1/118* (2013.01); *B29C 33/38* (2013.01); *B29C 33/42* (2013.01); *B29C 59/046* (2013.01); *B29C 2035/0827* (2013.01); *B29K 2505/02* (2013.01); *B29K 2905/02* (2013.01); *B29L 2031/757* (2013.01)

(58) Field of Classification Search
    USPC ................................................. 425/385, 175
    See application file for complete search history.

(56) References Cited

U.S. PATENT DOCUMENTS

| | | |
|---|---|---|
| 2003/0205475 A1 | 11/2003 | Sawitowski |
| 2006/0219325 A1 | 10/2006 | Kohara |
| 2007/0159698 A1 | 7/2007 | Taguchi et al. |
| 2010/0283165 A1 | 11/2010 | Ihara |
| 2012/0018613 A1 | 1/2012 | Hayashi et al. |
| 2013/0004612 A1 | 1/2013 | Isurugi et al. |
| 2013/0177841 A1* | 7/2013 | Sakai ........................ G03F 1/50 430/5 |
| 2014/0197036 A1 | 7/2014 | Isurugi et al. |

FOREIGN PATENT DOCUMENTS

| | | |
|---|---|---|
| JP | 2003531962 A | 10/2003 |
| JP | 2005156695 A | 6/2005 |
| JP | 2006070304 A | 3/2006 |
| JP | 2006-307318 A | 11/2006 |
| JP | 2009-166489 A | 7/2009 |
| WO | WO-2006059686 A1 | 6/2006 |
| WO | WO-2010073636 A1 | 7/2010 |
| WO | WO-2010116728 A1 | 10/2010 |
| WO | WO-2011/105206 A1 | 9/2011 |
| WO | WO-20121137664 A | 10/2012 |

* cited by examiner

FIG.1
(a)
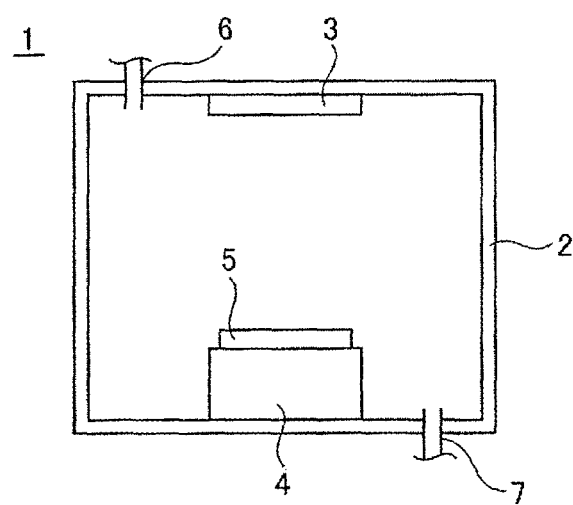
(b)
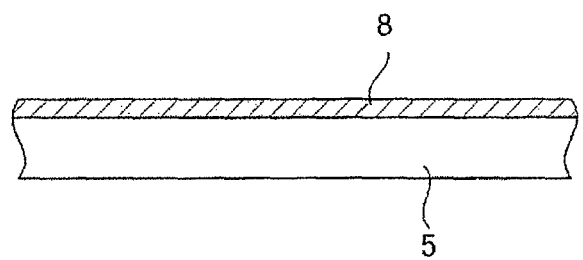

FIG. 2

FIG. 7
(a)
AMOUNT OF N2 / WITHOUT N2
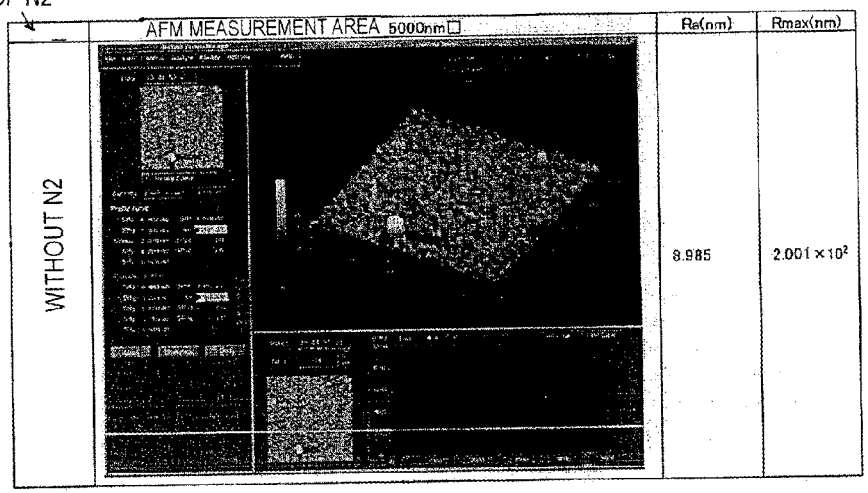
(b)
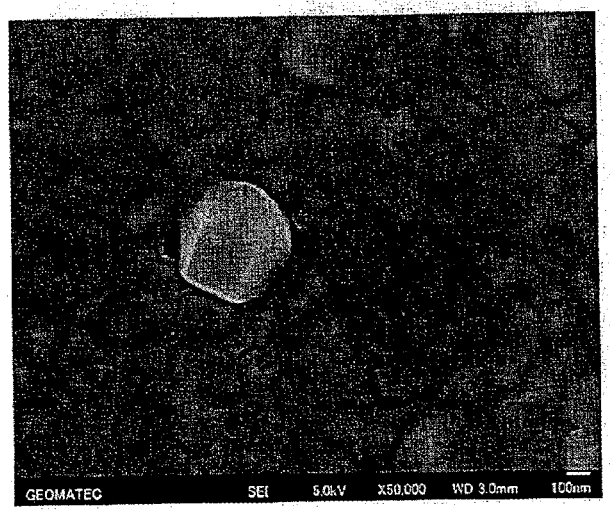

FIG.8
(a)
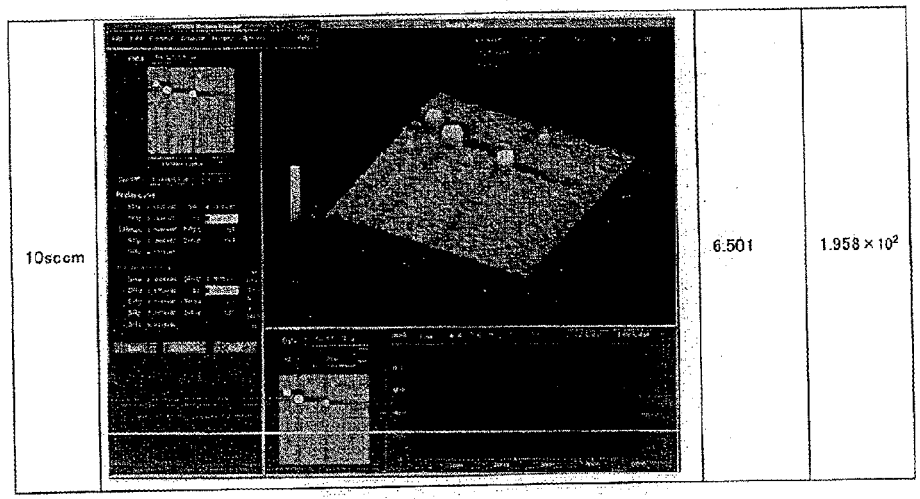
(b)
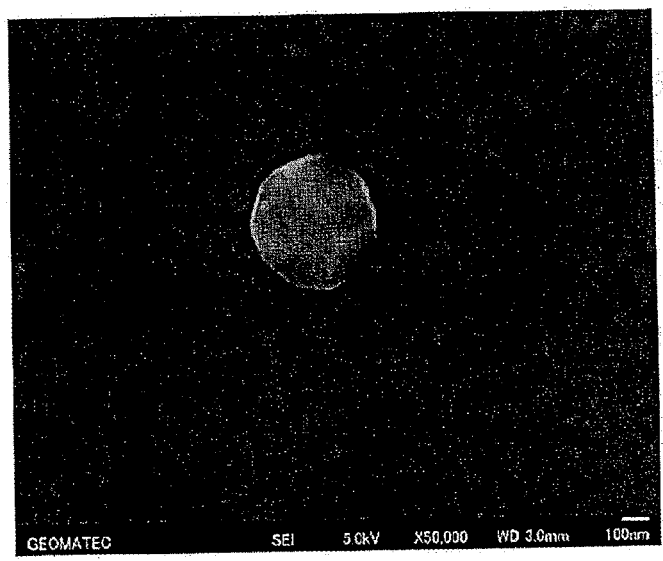

*FIG.10A*

| WAVE-LENGTH | AlTi FILM w/o N₂ INITIAL VALUE | N₂: 5sccm INITIAL VALUE | N₂: 10sccm INITIAL VALUE | N₂: 15sccm INITIAL VALUE | N₂: 20sccm INITIAL VALUE | PURE Al w/o N₂ INITIAL VALUE | PURE Al N₂:10sccm INITIAL VALUE |
|---|---|---|---|---|---|---|---|
| 400 | 85.401 | 87.046 | 88.818 | 87.348 | 84.737 | 81.022 | 88.911 |
| 402 | 85.44 | 87.111 | 88.771 | 87.409 | 84.854 | 81.106 | 87.018 |
| 404 | 85.485 | 87.199 | 88.732 | 87.506 | 85.05 | 81.133 | 87.135 |
| 406 | 85.536 | 87.293 | 88.722 | 87.468 | 85.141 | 81.269 | 87.214 |
| 408 | 85.595 | 87.402 | 88.759 | 87.488 | 85.145 | 81.467 | 87.373 |
| 410 | 85.677 | 87.366 | 88.785 | 87.44 | 85.249 | 81.666 | 87.469 |
| 412 | 85.788 | 87.355 | 88.847 | 87.43 | 85.274 | 81.800 | 87.534 |
| 414 | 85.897 | 87.329 | 88.915 | 87.408 | 85.278 | 81.867 | 87.586 |
| 416 | 86.04 | 87.537 | 88.893 | 87.433 | 85.355 | 81.974 | 87.58 |
| 418 | 86.017 | 87.706 | 88.918 | 87.539 | 85.519 | 82.158 | 87.413 |
| 420 | 86.172 | 87.905 | 88.911 | 87.649 | 85.004 | 82.326 | 87.468 |
| 422 | 86.18 | 88.035 | 88.991 | 87.601 | 85.607 | 82.414 | 87.469 |
| 424 | 86.243 | 88.182 | 89.125 | 87.626 | 85.54 | 82.564 | 87.537 |
| 426 | 86.208 | 88.232 | 89.02 | 87.553 | 85.638 | 82.686 | 87.673 |
| 428 | 86.475 | 88.229 | 89.099 | 87.536 | 85.636 | 82.785 | 87.796 |
| 430 | 86.61 | 88.127 | 89.096 | 87.449 | 85.553 | 83.002 | 87.988 |
| 432 | 86.732 | 88.048 | 89.092 | 87.457 | 85.688 | 83.121 | 88.063 |
| 434 | 86.783 | 88.015 | 89.033 | 87.333 | 85.723 | 83.207 | 88.032 |
| 436 | 86.845 | 88.017 | 89.052 | 87.38 | 85.751 | 83.341 | 88.01 |
| 438 | 86.933 | 88.037 | 89.1 | 87.431 | 85.882 | 83.527 | 87.919 |
| 440 | 87.055 | 88.085 | 89.184 | 87.542 | 86 | 83.599 | 87.828 |
| 442 | 87.031 | 88.016 | 89.237 | 87.608 | 85.959 | 83.658 | 87.819 |
| 444 | 87.078 | 88.091 | 89.184 | 87.674 | 85.947 | 83.806 | 87.824 |
| 446 | 87.111 | 88.024 | 89.136 | 87.652 | 85.98 | 83.831 | 87.817 |
| 448 | 87.196 | 88.033 | 88.981 | 87.738 | 85.955 | 83.921 | 87.987 |
| 450 | 87.282 | 88.018 | 89.031 | 87.684 | 85.892 | 84.02 | 88.058 |
| 452 | 87.334 | 88.095 | 89.094 | 87.685 | 85.839 | 84.091 | 88.106 |
| 454 | 87.45 | 88.071 | 89.138 | 87.562 | 85.883 | 84.115 | 88.142 |
| 456 | 87.537 | 88.178 | 89.154 | 87.481 | 85.902 | 84.266 | 88.069 |
| 458 | 87.566 | 88.251 | 89.243 | 87.457 | 85.802 | 84.446 | 88.042 |
| 460 | 87.643 | 88.394 | 89.27 | 87.497 | 85.939 | 84.673 | 88.01 |
| 462 | 87.687 | 88.52 | 89.244 | 87.5 | 85.985 | 84.767 | 88.006 |
| 464 | 87.61 | 88.479 | 89.19 | 87.597 | 86.117 | 84.82 | 88.057 |
| 466 | 87.663 | 88.493 | 89.203 | 87.839 | 86.197 | 84.856 | 88.145 |
| 468 | 87.803 | 88.481 | 89.269 | 87.681 | 86.228 | 84.829 | 88.277 |
| 470 | 87.790 | 88.4 | 89.245 | 87.737 | 86.105 | 84.846 | 88.358 |
| 472 | 87.822 | 88.415 | 89.182 | 87.753 | 86.078 | 84.933 | 88.4 |
| 474 | 87.898 | 88.361 | 89.16 | 87.698 | 86.021 | 84.972 | 88.42 |
| 476 | 87.887 | 88.489 | 89.092 | 87.644 | 85.947 | 85.211 | 88.436 |
| 478 | 87.857 | 88.493 | 89.109 | 87.561 | 85.872 | 85.467 | 88.425 |
| 480 | 87.833 | 88.531 | 89.105 | 87.593 | 85.814 | 85.633 | 88.351 |
| 482 | 87.898 | 88.506 | 89.12 | 87.622 | 85.845 | 85.697 | 88.318 |
| 484 | 87.898 | 88.566 | 88.178 | 87.595 | 85.923 | 85.715 | 88.25 |
| 486 | 87.819 | 88.573 | 89.311 | 87.605 | 86.017 | 85.621 | 88.222 |
| 488 | 87.786 | 88.544 | 89.247 | 87.664 | 86.089 | 85.575 | 88.205 |
| 490 | 87.865 | 88.581 | 89.259 | 87.588 | 86.091 | 85.561 | 88.194 |
| 492 | 87.907 | 88.539 | 89.236 | 87.688 | 86.18 | 85.518 | 88.252 |
| 494 | 87.914 | 88.591 | 89.242 | 87.657 | 86.239 | 85.526 | 88.285 |
| 496 | 88.081 | 88.605 | 89.28 | 87.555 | 86.232 | 85.602 | 88.377 |
| 498 | 88.162 | 88.596 | 89.297 | 87.544 | 86.189 | 85.689 | 88.402 |
| 500 | 88.156 | 88.603 | 89.243 | 87.532 | 86.151 | 85.774 | 88.471 |
| 502 | 88.223 | 88.628 | 89.233 | 87.593 | 86.089 | 85.818 | 88.492 |
| 504 | 88.177 | 88.703 | 89.255 | 87.713 | 86.091 | 85.878 | 88.495 |
| 506 | 88.119 | 88.666 | 89.332 | 87.713 | 86.13 | 85.908 | 88.479 |
| 508 | 88.097 | 88.635 | 89.33 | 87.068 | 86.143 | 86.028 | 88.407 |
| 510 | 88.089 | 88.641 | 89.259 | 87.705 | 88.145 | 86.223 | 88.345 |
| 512 | 88.141 | 88.729 | 89.284 | 87.662 | 86.161 | 86.36 | 88.295 |
| 514 | 88.173 | 88.777 | 89.386 | 87.613 | 86.211 | 88.459 | 88.326 |
| 516 | 88.243 | 88.733 | 89.258 | 87.608 | 86.255 | 86.581 | 88.326 |
| 518 | 88.342 | 88.785 | 89.189 | 87.625 | 86.284 | 86.61 | 88.37 |
| 520 | 88.3 | 88.767 | 89.165 | 87.571 | 86.236 | 86.577 | 88.454 |
| 522 | 88.281 | 88.751 | 89.152 | 87.625 | 86.174 | 86.556 | 88.502 |
| 524 | 88.318 | 88.69 | 89.111 | 87.58 | 86.144 | 86.555 | 88.512 |
| 526 | 88.359 | 88.663 | 89.165 | 87.588 | 86.188 | 86.562 | 88.496 |

FIG.10B

| WAVE-LENGTH | AlTi FILM w/o N$_2$ INITIAL VALUE | N$_2$: 5sccm INITIAL VALUE | N$_2$: 10sccm INITIAL VALUE | N$_2$: 15sccm INITIAL VALUE | N$_2$: 20sccm INITIAL VALUE | PURE Al w/o N$_2$ INITIAL VALUE | PURE Al N$_2$:10sccm INITIAL VALUE |
|---|---|---|---|---|---|---|---|
| 528 | 88.392 | 88.604 | 89.154 | 87.589 | 86.22 | 86.52 | 88.481 |
| 530 | 88.419 | 88.578 | 89.124 | 87.534 | 86.189 | 86.686 | 88.388 |
| 532 | 88.435 | 88.57 | 89.101 | 87.637 | 86.187 | 86.749 | 88.33 |
| 534 | 88.393 | 88.533 | 89.088 | 87.63 | 86.203 | 86.751 | 88.289 |
| 536 | 88.381 | 88.603 | 89.054 | 87.544 | 86.227 | 86.76 | 88.274 |
| 538 | 88.321 | 88.631 | 89.084 | 87.501 | 86.211 | 86.822 | 88.276 |
| 540 | 88.317 | 88.638 | 89.106 | 87.489 | 86.227 | 86.779 | 88.333 |
| 542 | 88.318 | 88.613 | 89.175 | 87.529 | 86.18 | 86.829 | 88.375 |
| 544 | 88.378 | 88.573 | 89.204 | 87.52 | 86.134 | 86.907 | 88.424 |
| 546 | 88.431 | 88.56 | 89.148 | 87.502 | 86.182 | 86.958 | 88.454 |
| 548 | 88.487 | 88.579 | 89.111 | 87.498 | 86.179 | 86.994 | 88.449 |
| 550 | 88.54 | 88.548 | 89.051 | 87.515 | 86.198 | 86.974 | 88.366 |
| 552 | 88.564 | 88.631 | 88.978 | 87.493 | 86.202 | 86.988 | 88.321 |
| 554 | 88.554 | 88.697 | 88.949 | 87.471 | 86.192 | 86.994 | 88.268 |
| 556 | 88.545 | 88.898 | 88.914 | 87.484 | 86.184 | 87.064 | 88.172 |
| 558 | 88.498 | 88.731 | 88.922 | 87.476 | 86.201 | 87.08 | 88.184 |
| 560 | 88.584 | 88.716 | 88.934 | 87.621 | 86.191 | 87.125 | 88.228 |
| 562 | 88.581 | 88.565 | 88.947 | 87.71 | 86.217 | 87.196 | 88.231 |
| 564 | 88.616 | 88.581 | 88.873 | 87.728 | 86.243 | 87.188 | 88.234 |
| 566 | 88.591 | 88.555 | 88.902 | 87.705 | 86.289 | 87.149 | 88.293 |
| 568 | 88.573 | 88.577 | 88.856 | 87.639 | 86.3 | 87.113 | 88.335 |
| 570 | 88.57 | 88.599 | 88.794 | 87.611 | 86.244 | 87.104 | 88.326 |
| 572 | 88.583 | 88.609 | 88.809 | 87.59 | 86.147 | 87.047 | 88.39 |
| 574 | 88.516 | 88.667 | 88.728 | 87.505 | 86.09 | 87.007 | 88.34 |
| 576 | 88.421 | 88.684 | 88.739 | 87.5 | 86.04 | 87.039 | 88.292 |
| 578 | 88.405 | 88.654 | 88.756 | 87.511 | 86.028 | 87.022 | 88.124 |
| 580 | 88.425 | 88.659 | 88.825 | 87.514 | 86.088 | 87.086 | 88.127 |
| 582 | 88.397 | 88.592 | 88.867 | 87.509 | 86.158 | 87.111 | 88.152 |
| 584 | 88.434 | 88.514 | 88.842 | 87.471 | 86.118 | 87.213 | 88.181 |
| 586 | 88.425 | 88.537 | 88.891 | 87.438 | 86.151 | 87.3 | 88.289 |
| 588 | 88.509 | 88.573 | 88.873 | 87.447 | 86.207 | 87.279 | 88.424 |
| 590 | 88.545 | 88.601 | 88.867 | 87.506 | 86.219 | 87.345 | 88.449 |
| 592 | 88.561 | 88.69 | 88.809 | 87.488 | 86.303 | 87.395 | 88.421 |
| 594 | 88.522 | 88.598 | 88.814 | 87.522 | 86.432 | 87.348 | 88.399 |
| 596 | 88.51 | 88.724 | 88.813 | 87.549 | 86.498 | 87.347 | 88.293 |
| 598 | 88.446 | 88.683 | 88.802 | 87.595 | 86.51 | 87.314 | 88.205 |
| 600 | 88.401 | 88.518 | 88.825 | 87.628 | 86.395 | 87.295 | 88.173 |
| 602 | 88.448 | 88.392 | 88.75 | 87.535 | 86.304 | 87.283 | 88.135 |
| 604 | 88.437 | 88.219 | 88.724 | 87.368 | 86.187 | 87.273 | 88.153 |
| 606 | 88.518 | 88.107 | 88.814 | 87.286 | 86.128 | 87.291 | 88.173 |
| 608 | 88.577 | 88.194 | 88.598 | 87.261 | 86.09 | 87.355 | 88.175 |
| 610 | 88.615 | 88.283 | 88.588 | 87.224 | 86.082 | 87.336 | 88.148 |
| 612 | 88.62 | 88.323 | 88.562 | 87.154 | 86.009 | 87.422 | 88.087 |
| 614 | 88.523 | 88.495 | 88.643 | 87.212 | 85.996 | 87.471 | 88.043 |
| 616 | 88.444 | 88.551 | 88.678 | 87.252 | 86.075 | 87.374 | 88.008 |
| 618 | 88.394 | 88.579 | 88.771 | 87.308 | 86.066 | 87.334 | 88.029 |
| 620 | 88.309 | 88.545 | 88.789 | 87.253 | 86.102 | 87.336 | 88.101 |
| 622 | 88.231 | 88.459 | 88.861 | 87.26 | 86.161 | 87.404 | 88.081 |
| 624 | 88.23 | 88.376 | 88.792 | 87.212 | 86.254 | 87.478 | 88.166 |
| 626 | 88.265 | 88.256 | 88.677 | 87.272 | 86.295 | 87.43 | 88.141 |
| 628 | 88.247 | 88.174 | 88.657 | 87.311 | 86.191 | 87.42 | 88.103 |
| 630 | 88.29 | 88.144 | 88.649 | 87.47 | 86.204 | 87.475 | 87.973 |
| 632 | 88.314 | 88.066 | 88.642 | 87.399 | 86.119 | 87.379 | 87.859 |
| 634 | 88.298 | 88.097 | 88.573 | 87.397 | 86.091 | 87.317 | 87.823 |
| 636 | 88.205 | 88.127 | 88.48 | 87.403 | 86.063 | 87.291 | 87.911 |
| 638 | 88.166 | 88.119 | 88.428 | 87.268 | 86.131 | 87.28 | 87.995 |
| 640 | 88.132 | 88.108 | 88.395 | 87.126 | 86.082 | 87.353 | 88.058 |
| 642 | 88.086 | 88.106 | 88.37 | 87.091 | 86.042 | 87.377 | 88.134 |
| 644 | 88.081 | 88.103 | 88.369 | 87.069 | 86.064 | 87.348 | 88.194 |
| 646 | 88.123 | 88.064 | 88.286 | 87.125 | 86.081 | 87.395 | 88.208 |
| 648 | 88.157 | 88.079 | 88.283 | 87.022 | 86.079 | 87.31 | 88.145 |
| 650 | 88.173 | 88.094 | 88.31 | 87.096 | 86.068 | 87.325 | 88.002 |
| 652 | 88.129 | 88.074 | 88.31 | 87.07 | 86.13 | 87.286 | 88.035 |
| 654 | 88.100 | 88.076 | 88.271 | 87.116 | 86.172 | 87.177 | 87.955 |

FIG. 10C

| WAVE-LENGTH | AlTi FILM w/o N$_2$ INITIAL VALUE | N$_2$: 5sccm INITIAL VALUE | N$_2$: 10sccm INITIAL VALUE | N$_2$: 15sccm INITIAL VALUE | N$_2$: 20sccm INITIAL VALUE | PURE Al w/o N$_2$ INITIAL VALUE | PURE Al N$_2$:10sccm INITIAL VALUE |
|---|---|---|---|---|---|---|---|
| 656 | 88.028 | 88 | 88.253 | 87.038 | 86.14 | 87.124 | 87.868 |
| 658 | 87.904 | 87.954 | 88.282 | 87.173 | 86.19 | 87.239 | 87.81 |
| 660 | 88.037 | 87.904 | 88.283 | 87.219 | 86.185 | 87.269 | 87.777 |
| 662 | 88.038 | 87.88 | 88.303 | 87.332 | 86.121 | 87.312 | 87.722 |
| 664 | 88.104 | 87.937 | 88.297 | 87.408 | 86.096 | 87.354 | 87.84 |
| 666 | 88.127 | 87.918 | 88.284 | 87.403 | 86.154 | 87.393 | 87.859 |
| 668 | 88.123 | 87.909 | 88.278 | 87.433 | 86.104 | 87.441 | 87.819 |
| 670 | 88.137 | 87.856 | 88.179 | 87.416 | 86.174 | 87.434 | 87.782 |
| 672 | 88.082 | 87.881 | 88.244 | 87.336 | 86.235 | 87.379 | 87.824 |
| 674 | 87.924 | 87.82 | 88.194 | 87.324 | 86.32 | 87.411 | 87.783 |
| 676 | 87.778 | 87.826 | 88.253 | 87.267 | 86.409 | 87.355 | 87.64 |
| 678 | 87.648 | 87.771 | 88.134 | 87.296 | 86.379 | 87.343 | 87.585 |
| 680 | 87.629 | 87.824 | 88.079 | 87.3 | 86.327 | 87.298 | 87.454 |
| 682 | 87.634 | 87.643 | 88.006 | 87.282 | 86.298 | 87.182 | 87.423 |
| 684 | 87.654 | 87.558 | 88.087 | 87.254 | 86.303 | 86.832 | 87.48 |
| 686 | 87.77 | 87.53 | 88.075 | 87.206 | 86.32 | 86.82 | 87.596 |
| 688 | 87.9 | 87.446 | 88.06 | 87.158 | 86.355 | 86.77 | 87.642 |
| 690 | 87.885 | 87.338 | 88.048 | 87.099 | 86.321 | 86.608 | 87.654 |
| 692 | 87.871 | 87.35 | 88.061 | 87.009 | 86.343 | 86.891 | 87.598 |
| 694 | 87.783 | 87.383 | 88.05 | 86.922 | 86.335 | 86.047 | 87.657 |
| 696 | 87.645 | 87.364 | 88.053 | 86.921 | 86.275 | 86.995 | 87.577 |
| 698 | 87.5 | 87.371 | 87.964 | 86.955 | 86.261 | 87.012 | 87.499 |
| 700 | 87.581 | 87.45 | 87.931 | 86.989 | 86.216 | 86.961 | 87.467 |
| AVERAGE | 87.849 | 86.244 | 88.827 | 87.453 | 86.054 | 85.972 | 88.051 |

FIG. 11

| AlTi FILM | NHT HARDNESS MEASUREMENT | | | | ADHERENCE TEST | |
|---|---|---|---|---|---|---|
| | NHT HARDNESS [GPa] | Hv CONVERTED HARDNESS | YOUNG'S MODULUS [GPa] | MAXIMUM INDENTER DEPTH [nm] | VICKERS INDENTATION | SCRATCHES |
| WITHOUT SUPPLY OF N$_2$ | 1.0 | 96.6 | 73.9 | 193.7 | NO PEELING | |
| N2 5sccm | 1.7 | 155.8 | 78.0 | 154.1 | | |
| N2 10sccm | 2.1 | 194.7 | 77.7 | 140.7 | | |
| N2 15sccm | 2.4 | 225.7 | 95.3 | 130.4 | | |
| N2 20sccm | 2.5 | 229.2 | 82.5 | 131.2 | | |

FIG. 12

Avg. SPECIFIC RESISTANCE [μΩcm]

| AlTi FILM w/o N2 | FILM THICKNESS | 659 | 665 | 674 | 666.90 | 5.552 |
|---|---|---|---|---|---|---|
| | RESISTANCE VALUE | 0.0839 | 0.0839 | 0.0826 | 0.0833 | |
| N2:5sccm | FILM THICKNESS | 783 | 791 | 808 | 796.05 | 7.758 |
| | RESISTANCE VALUE | 0.1005 | 0.0970 | 0.0944 | 0.0975 | |
| N2:10sccm | FILM THICKNESS | 742 | 741 | 766 | 754.70 | 9.966 |
| | RESISTANCE VALUE | 0.1366 | 0.1314 | 0.1275 | 0.1321 | |
| N2:15sccm | FILM THICKNESS | 766 | 788 | 790 | 778.75 | 13.317 |
| | RESISTANCE VALUE | 0.1775 | 0.1675 | 0.1645 | 0.1710 | |
| N2:20sccm | FILM THICKNESS | 736 | 748 | 763 | 749.90 | 17.311 |
| | RESISTANCE VALUE | 0.2392 | 0.2152 | 0.2225 | 0.2309 | |

FIG.13
AMOUNT OF CONSTITUENTS [wt%]

| Et (sec) | | 10sec | 30sec | 60sec | 120sec |
|---|---|---|---|---|---|
| WITHOUT SUPPLY OF N2 N2=0sccm | O | 20.7 | 10.2 | 2.7 | 3.1 |
| | Ti | 0.8 | 1.9 | 1.8 | 1.5 |
| | N | – | – | – | – |
| | Al | 78.5 | 87.8 | 95.5 | 95.3 |
| | C | – | – | – | – |
| WITH SUPPLY OF N2 N2=5sccm | O | 21.9 | 1.8 | 1.6 | 1.1 |
| | Ti | 0.0 | 1.5 | 1.2 | 1.0 |
| | N | 0.5 | 0.7 | 0.6 | 0.9 |
| | Al | 77.5 | 96.1 | 96.7 | 97.1 |
| | C | – | – | – | – |
| WITH SUPPLY OF N2 N2=10sccm | O | 16.0 | 5.2 | 1.9 | 1.8 |
| | Ti | 0.0 | 1.1 | 1.8 | 1.3 |
| | N | 1.2 | 1.5 | 1.8 | 2.0 |
| | Al | 82.8 | 92.1 | 94.4 | 94.9 |
| | C | – | – | – | – |
| WITH SUPPLY OF N2 N2=15sccm | O | 21.3 | 2.5 | 2.9 | 2.2 |
| | Ti | 0.0 | 1.1 | 1.6 | 1.9 |
| | N | 1.5 | 2.9 | 3.5 | 4.1 |
| | Al | 77.2 | 93.6 | 92.0 | 91.8 |
| | C | – | – | – | – |
| WITH SUPPLY OF N2 N2=20sccm | O | 20.6 | 4.7 | 6.6 | 4.5 |
| | Ti | 0.0 | 1.5 | 1.0 | 1.4 |
| | N | 2.2 | 4.5 | 5.2 | 5.7 |
| | Al | 77.2 | 89.3 | 87.2 | 88.5 |
| | C | – | – | – | – |

FIG.14
(a)
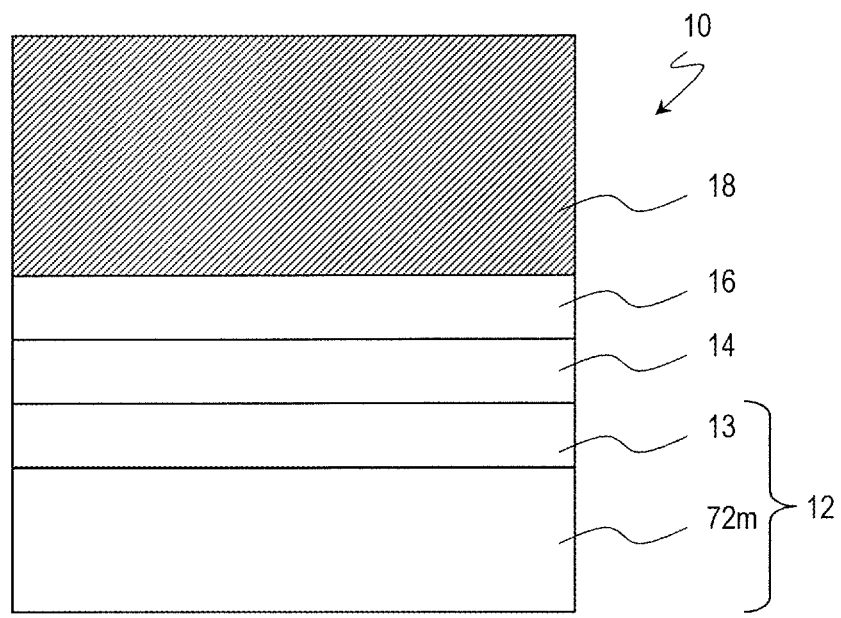
(b)
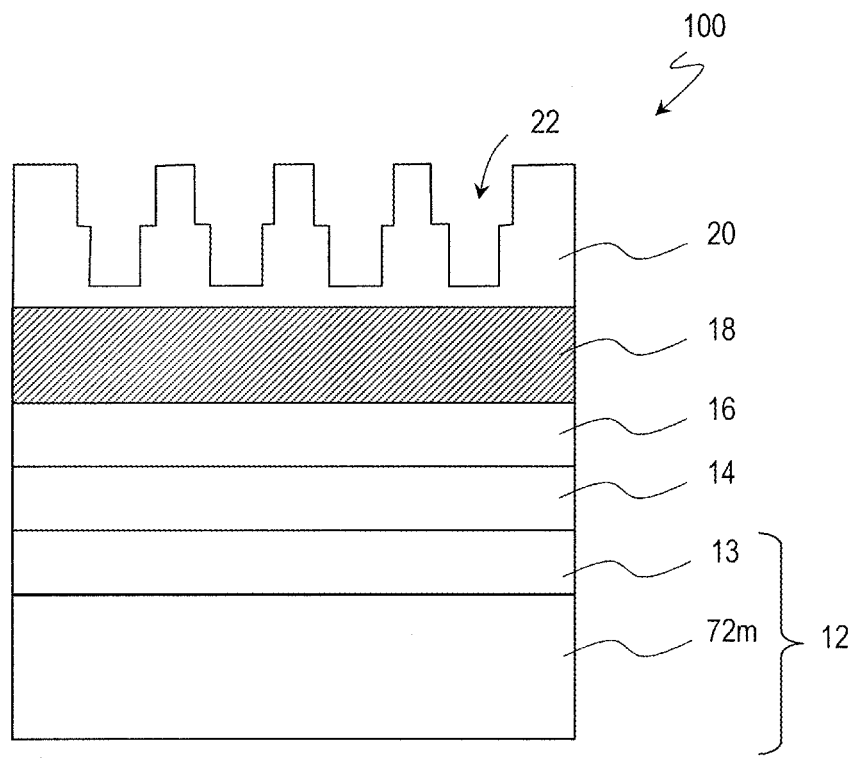

FIG.19
(a)
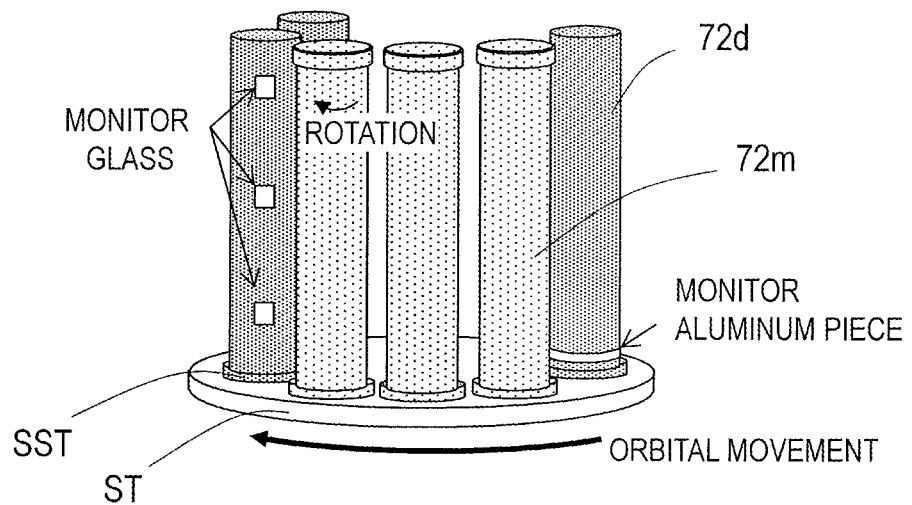
(b)
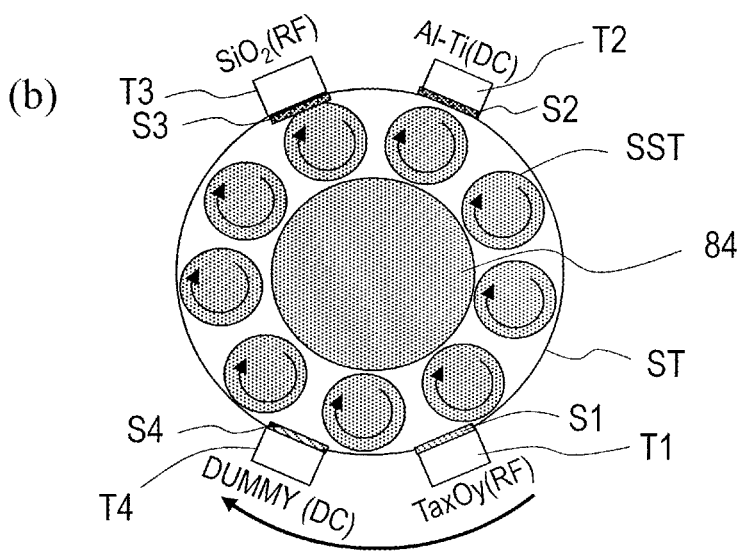

| SAMPLES | TARGET DISTANCE | N2 | SHIELD MEMBER | Y VALUE OF CR331 | |
|---|---|---|---|---|---|
| | | | | 1st POINT | 2nd POINT |
| A | 14.5cm | × | × | | |
| B | 10cm | ○ | DISTANT | 10.38 | |
| C | 10cm | ○ | ○ | 4.75 | 5.22 |
| D | 10cm | ○ | ○ | 4.72 | |
| E | 7cm | × | ○ | 12.81 | 9.99 |
| F | 7cm | × | ○ | 16.4 | 14.1 |
| G | 7cm | ○ | ○ | 2.20 | 2.19 |
| H | 7cm | ○ | ○ | 2.13 | 2.17 |
| COMPAR-ATIVE | NO DEPOSITION | | | 5.17 | |

SAME CONDITIONS (C, D)
SAME CONDITIONS (E, F)
SAME CONDITIONS (G, H)

FIG.30

| Et (sec) | | 10sec | 30sec | 60sec | 120sec | 180sec |
|---|---|---|---|---|---|---|
| WITHOUT SUPPLY OF N₂ N₂=0sccm | O | 44.7 | 44.0 | 43.9 | 41.6 | 1.7 |
| | Ti | 0.0 | 0.0 | 0.0 | 0.0 | 0.9 |
| | N | 0.0 | 0.0 | 0.0 | 0.0 | 0.0 |
| | Al | 55.3 | 56.0 | 56.1 | 58.4 | 97.4 |
| | C | 0.0 | - | - | - | - |
| WITH SUPPLY OF N₂ N₂=10sccm | O | 43.2 | 43.1 | 42.2 | 36.5 | 8.0 |
| | Ti | 0.0 | 0.0 | 0.0 | 0.0 | 0.0 |
| | N | 0.8 | 1.1 | 0.5 | 0.9 | 2.1 |
| | Al | 56.0 | 55.8 | 57.3 | 62.6 | 88.0 |
| | C | 0.0 | - | - | - | - |
| WITH SUPPLY OF N₂ N₂=15sccm | O | 43.5 | 42.4 | 42.4 | 36.7 | 11.3 |
| | Ti | 0.0 | 0.0 | 0.0 | 0.7 | 0.7 |
| | N | 0.7 | 0.9 | 0.9 | 1.4 | 3.5 |
| | Al | 55.9 | 56.7 | 56.7 | 61.3 | 84.4 |
| | C | - | - | - | - | - |
| WITH SUPPLY OF N₂ N₂=20sccm | O | 43.5 | 42.6 | 42.3 | 33.8 | 10.5 |
| | Ti | 0.0 | 0.0 | 0.0 | 0.4 | 1.0 |
| | N | 0.8 | 1.2 | 1.1 | 1.7 | 4.4 |
| | Al | 55.7 | 56.2 | 56.6 | 64.2 | 84.1 |
| | C | - | - | - | - | - |

FIG.31
(a) 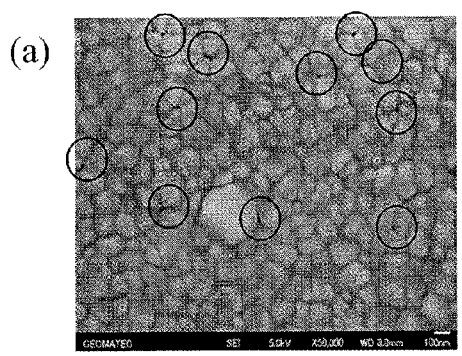
(b) 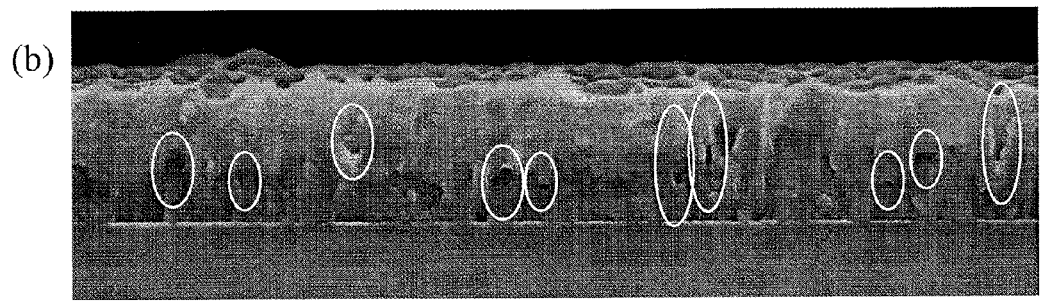

FIG.33
(a) 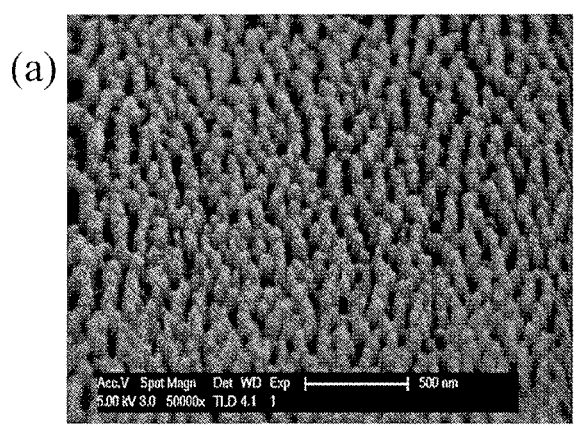
(b) 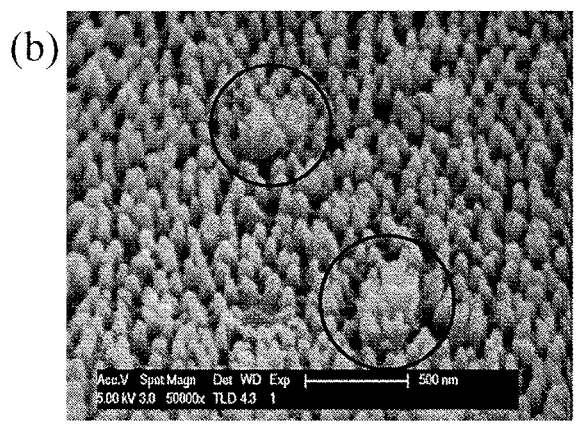

MOLD BASE MATERIAL, PRODUCTION METHOD FOR MOLD BASE MATERIAL, MOLD PRODUCTION METHOD, AND MOLD

TECHNICAL FIELD

The present invention relates to a mold base, a mold base manufacturing method, a mold manufacturing method, and a mold, and particularly to a mold which has a porous alumina layer over its surface. In this specification, the "mold" includes molds that are for use in various processing methods (stamping and casting), and is sometimes referred to as a stamper. The "mold" can also be used for printing (including nanoimprinting).

BACKGROUND ART

Display devices for use in TVs, cell phones, etc., and optical elements, such as camera lenses, etc., usually adopt an antireflection technique in order to reduce the surface reflection and increase the amount of light transmitted therethrough. This is because, when light is transmitted through the interface between media of different refractive indices, e.g., when light is incident on the interface between air and glass, the amount of transmitted light decreases due to, for example, Fresnel reflection, thus deteriorating the visibility.

An antireflection technique which has been receiving attention in recent years is forming over a substrate surface a very small uneven pattern in which the interval of recessed portions or raised portions is not more than the wavelength of visible light ($\lambda$=380 nm to 780 nm). See Patent Documents 1 to 4. The two-dimensional size of a raised portion of an uneven pattern which performs an antireflection function is not less than 10 nm and less than 500 nm.

This method utilizes the principles of a so-called moth-eye structure. The refractive index for light that is incident on the substrate is continuously changed along the depth direction of the recessed portions or raised portions, from the refractive index of a medium on which the light is incident to the refractive index of the substrate, whereby reflection of a wavelength band that is subject to antireflection is prevented.

The moth-eye structure is advantageous in that it is capable of performing an antireflection function with small incident angle dependence over a wide wavelength band, as well as that it is applicable to a number of materials, and that an uneven pattern can be directly formed in a substrate. As such, a high-performance antireflection film (or antireflection surface) can be provided at a low cost.

As the method of forming a moth-eye structure, using an anodized porous alumina layer which is obtained by means of anodization of aluminum has been receiving attention (Patent Documents 2 to 4).

Now, the anodized porous alumina layer which is obtained by means of anodization of aluminum is briefly described. Conventionally, a method of forming a porous structure by means of anodization has been receiving attention as a simple method for making nanometer-scale micropores (very small recessed portions) in the shape of a circular column in a regular arrangement. An aluminum base is immersed in an acidic electrolytic solution of sulfuric acid, oxalic acid, phosphoric acid, or the like, or an alkaline electrolytic solution, and this is used as an anode in application of a voltage, which causes oxidation and dissolution. The oxidation and the dissolution concurrently advance over a surface of the aluminum base to form an oxide film which has micropores over its surface. The micropores, which are in the shape of a circular column, are oriented vertical to the oxide film and exhibit a self-organized regularity under certain conditions (voltage, electrolyte type, temperature, etc.). Thus, this anodized porous alumina layer is expected to be applied to a wide variety of functional materials.

A porous alumina layer formed under specific conditions includes cells in the shape of a generally regular hexagon which are in a closest packed two-dimensional arrangement when seen in a direction perpendicular to the film surface. Each of the cells has a micropore at its center. The arrangement of the micropores is periodic. The cells are formed as a result of local dissolution and growth of a coating. The dissolution and growth of the coating concurrently advance at the bottom of the micropores which is referred to as a barrier layer. As known, the interval between adjacent micropores (the distance between the centers), is approximately twice the thickness of the barrier layer, and is approximately proportional to the voltage that is applied during the anodization. It is also known that the diameter of the micropores depends on the type, concentration, temperature, etc., of the electrolytic solution but is, usually, about ⅓ of the size of the cells (the length of the longest diagonal of the cell when seen in a direction vertical to the film surface). Such micropores of the porous alumina may constitute an arrangement which has a high regularity (periodicity) under specific conditions, an arrangement with a regularity degraded to some extent depending on the conditions, or an irregular (non-periodic) arrangement.

Patent Document 2 discloses a method of producing an antireflection film (antireflection surface) with the use of a stamper which has an anodized porous alumina film over its surface.

Patent Document 3 discloses the technique of forming tapered recesses with continuously changing pore diameters by repeating anodization of aluminum and a pore diameter increasing process.

The applicant of the present application discloses, in Patent Document 4, the technique of forming an antireflection film with the use of an alumina layer in which very small recessed portions have stepped lateral surfaces.

As described in Patent Documents 1, 2, and 4, by providing an uneven structure (macro structure) which is greater than a moth-eye structure (micro structure) in addition to the moth-eye structure, the antireflection film (antireflection surface) can be provided with an antiglare function. The two-dimensional size of a raised portion of the uneven structure which is capable of performing the antiglare function is not less than 1 μm and less than 100 μm.

Utilizing an anodized porous aluminum film can facilitate the manufacture of a mold which is used for formation of a moth-eye structure over a surface (hereinafter, "moth-eye mold"). In particular, as described in Patent Documents 2 and 4, when the surface of the anodized aluminum film as formed is used as a mold without any modification, a large effect of reducing the manufacturing cost is achieved. The structure of the surface of a moth-eye mold which is capable of forming a moth-eye structure is herein referred to as "inverted moth-eye structure".

A known antireflection film production method with the use of a moth-eye mold uses a photocurable resin. Firstly, a photocurable resin is applied over a substrate. Then, an uneven surface of a moth-eye mold which has undergone a mold release treatment is pressed against the photocurable resin in vacuum, whereby the uneven structure at the surface of the moth-eye mold is filled with the photocurable resin. Then, the photocurable resin in the uneven structure is irradiated with ultraviolet light so that the photocurable resin is cured. Thereafter, the moth-eye mold is separated from the substrate, whereby a cured layer of the photocurable resin to which the uneven structure of the moth-eye mold has been transferred is formed over the surface of the substrate. The method of producing an antireflection film with the use of the photocurable resin is disclosed in, for example, Patent Document 4.

The above-described moth-eye mold can be fabricated using an aluminum base, such as typically a substrate made of aluminum or a cylinder made of aluminum, or an aluminum film formed on a support that is made of a non-aluminum material, such as typically a glass substrate. However, in a moth-eye mold manufactured using an aluminum film formed on a glass substrate or plastic film, the adhesive property between the aluminum film (part of which is an anodized film) and the glass substrate or plastic film deteriorates in some cases. The applicant of the present application found that, by forming an inorganic underlayer (e.g., $SiO_2$ layer) and a buffer layer containing aluminum (e.g., $AlO_x$ layer) on a surface of a base which is made of glass or plastic, the above-described deterioration of the adhesive property is prevented. This is disclosed in Patent Document 5.

The applicant of the present application developed a method for efficiently producing an antireflection film using a moth-eye mold in the form of a cylinder (roll) according to a roll-to-roll method (e.g., WO 2011/105206). The moth-eye mold in the form of a cylinder can be formed by, for example, forming an organic insulating layer over an outer perimeter surface of a metal cylinder, forming an aluminum film on this organic insulating layer, and alternately and repeatedly performing anodization and etching on the aluminum film. In this case also, the adhesive property can be improved by forming the inorganic underlayer and the buffer layer disclosed in Patent Document 5.

According to further researches carried out by the present inventors, an aluminum film formed on an organic insulating layer contains abnormal grains in many cases. The abnormal grains are formed by abnormal growth of a crystal of aluminum. The aluminum film is an aggregation of crystal grains whose average grain diameter (average grain size) is about 200 nm. On the other hand, the grain diameter of the abnormal grains is larger than the average grain diameter, e.g., not less than 500 nm in some cases. The organic insulating layer has a lower thermal conductivity than the other materials (metal materials and inorganic insulating films), and therefore, the aluminum film readily reaches a relatively high temperature in the process of depositing the aluminum film (e.g., sputtering or vapor deposition). As a result, it is inferred that abnormal growth of crystal grains is likely to occur, i.e., abnormal grains are likely to be produced. Note that such a phenomenon can also occur when an aluminum film is directly deposited on a surface of an aluminum pipe (e.g., the thickness is not less than 1 mm).

When a moth-eye mold is manufactured using an aluminum film in which abnormal grains are present, structures corresponding to the abnormal grains are formed in the surface of a porous alumina layer of the moth-eye mold. When an antireflection film is formed using such a moth-eye mold, the structures corresponding to the abnormal grains are transferred to the surface of the antireflection film. Therefore, light is scattered by the structures transferred to the surface of the antireflection film which are attributed to the abnormal grains. That is, the antireflection film has a haze. In the case where the antireflection film is provided with an antiglare function as described above, no problem occurs in some cases even when the antireflection film has a haze which is attributed to the abnormal grains. However, there is such a problem that an antireflection film which does not have an antiglare function cannot be producing. Further, it is difficult to control the formation density (frequency of occurrence) of abnormal grains, and therefore, from the viewpoint of mass productivity, preventing production of abnormal grains is preferred.

The present inventors disclose in the international patent application (PCT/JP2012/058394, WO 2012/137664) that an aluminum alloy layer which contains aluminum and such a metal element that the absolute value of the difference between the standard electrode potential of the metal element and the standard electrode potential of aluminum is not more than 0.64 V (for example, the metal element may be Ti, Nd, Mn, Mg, Zr, V, and Pb, and the content of the metal element in the entire aluminum alloy layer is less than 10 mass %) scarcely contains abnormal grains, and as a result, a mold can be obtained which is capable of producing an antireflection film that does not have an undesirable haze.

The entire disclosures of Patent Documents 1, 2, 4, and 5 and the above-identified international patent application are herein incorporated by reference.

CITATION LIST

Patent Literature

Patent Document 1: Japanese PCT National Phase Laid-Open Publication No. 2001-517319
Patent Document 2: Japanese PCT National Phase Laid-Open Publication No. 2003-531962
Patent Document 3: Japanese Laid-Open Patent Publication No. 2005-156695
Patent Document 4: WO 2006/059686
Patent Document 5: WO 2010/116728
Patent Document 6: WO 2010/073636

SUMMARY OF INVENTION

Technical Problem

According to further researches carried out by the present inventors, it was found that when occurrence of abnormal grains is prevented using the method described in the above-identified international patent application, the resultant aluminum alloy layer has high specularity, but stable formation of an aluminum alloy layer of higher specularity (e.g., with the average reflectance to visible light being not less than 86%) is not easy. It was found that the reason for that is that when forming an aluminum alloy layer which has a thickness of not less than 500 nm, the crystal grain diameter is likely to increase, and as a result, the surface roughness is likely to increase, and voids are likely to be formed between crystal grains.

The present invention was conceived for the purpose of solving the above problems. The major objects of the present invention include providing a mold base which includes an aluminum alloy layer of high specularity and a manufacturing method of the mold base, and providing a manufacturing method of a mold which includes the mold base and a mold which includes the mold base.

Solution to Problem

A mold base of an embodiment of the present invention is a mold base for use in manufacture of a mold that has a porous alumina layer over its surface, including: a base; and an aluminum alloy layer provided on the base, wherein the aluminum alloy layer contains aluminum, a non-aluminum metal element, and nitrogen. The thickness of the aluminum alloy layer is preferably not less than 500 nm and not more than 1000 nm.

In one embodiment, an average grain diameter of crystal grains that form the aluminum alloy layer when viewed in a normal direction of the aluminum alloy layer is not more than 100 nm, and a maximum surface roughness Rmax of the aluminum alloy layer is not more than 60 nm.

In one embodiment, a content of the nitrogen in the aluminum alloy layer is not less than 0.5 mass % and not more than 5.7 mass %.

In one embodiment, an absolute value of a difference between a standard electrode potential of the metal element and a standard electrode potential of aluminum is not more than 0.64 V, and a content of the metal element in the aluminum alloy layer is not less than 1.0 mass % and not more than 1.9 mass %.

In one embodiment, the metal element is Ti or Nd. The metal element is not limited to these examples but may be such a different metal element that the absolute value of the difference between the standard electrode potential of the metal element and the standard electrode potential of aluminum is not more than 0.64 V (for example, Mn, Mg, Zr, V, and Pb). The metal element may be Mo, Nb, or Hf. The aluminum alloy layer may contain two or more of these metal elements.

In one embodiment, the base is a metal base, and the mold base further includes an inorganic underlayer provided between the metal base and the aluminum alloy layer.

In one embodiment, the mold base further includes an organic insulating layer provided between the metal base and the inorganic underlayer.

In one embodiment, the mold base further includes a buffer layer provided between the inorganic underlayer and the aluminum alloy layer, wherein the buffer layer contains aluminum, the metal element, and oxygen or nitrogen. In one embodiment, the thickness of the buffer layer is preferably not less than 10 nm and not more than 500 nm.

In one embodiment, the buffer layer has such a profile that the contents of aluminum and the metal element in the buffer layer are higher in a portion which is closer to the aluminum alloy layer than in another portion which is closer to the inorganic underlayer.

In one embodiment, the inorganic underlayer is a silicon oxide layer, a tantalum oxide layer, or a titanium oxide layer. In one embodiment, the thickness of the inorganic underlayer is preferably not less than 50 nm and not more than 300 nm.

In one embodiment, the organic insulating layer is an electrodeposition layer.

In one embodiment, the metal base has a cylindrical shape, and the inorganic underlayer is provided over an outer perimeter surface of the cylindrical metal base.

A mold base manufacturing method of an embodiment of the present invention is a method for manufacturing a mold base that includes a cylindrical base and an aluminum alloy layer provided on the base, the aluminum alloy layer containing aluminum, a non-aluminum metal element, and nitrogen, the method including the steps of: (a) arranging the cylindrical base in a film formation chamber so as to be at least capable of rotating around its own cylindrical axis; and (b) depositing the aluminum alloy layer over an outer perimeter surface of the base according to a DC magnetron sputtering method, using a target that contains aluminum and a non-aluminum metal element, in an atmosphere in the film formation chamber in which a nitrogen gas is mixed, while the base is kept rotating around its own cylindrical axis.

In one embodiment, step (a) includes arranging a plurality of cylindrical bases such that each of the plurality of cylindrical bases is capable of rotating around its own cylindrical axis and the axes of the plurality of bases orbit along an identical circumference, and in step (b), each of the plurality of bases orbits along the circumference while rotating around its own cylindrical axis.

In one embodiment, step (a) includes arranging a shield member between the plurality of bases.

A mold manufacturing method of an embodiment of the present invention is a method for manufacturing a mold which has an inverted moth-eye structure over its surface, the inverted moth-eye structure having a plurality of recessed portions whose two-dimensional size viewed in a direction normal to its surface is not less than 10 nm and less than 500 nm, the method including the steps of: (a) providing the mold base as set forth in any of the above paragraphs; (b) partially anodizing the aluminum alloy layer to form a porous alumina layer which has a plurality of minute recessed portions; (c) after step (b), bringing the porous alumina layer into contact with an etching solution, thereby enlarging the plurality of minute recessed portions of the porous alumina layer; and (d) after step (c), further performing anodization to grow the plurality of minute recessed portions.

In one embodiment, step (b) and step (c) are further performed after step (d).

A mold of an embodiment of the present invention includes: a base; and a porous alumina layer provided on the base, wherein the porous alumina layer has a plurality of recessed portions whose two-dimensional size viewed in a direction normal to its surface is not less than 10 nm and less than 500 nm and contains nitrogen, the porous alumina layer having an inverted moth-eye structure over its surface.

In one embodiment, the mold further includes an aluminum alloy layer provided between the base and the porous alumina layer, wherein the aluminum alloy layer contains aluminum, a non-aluminum metal element, and nitrogen.

Advantageous Effects of Invention

According to embodiments of the present invention, a mold base which includes an aluminum alloy layer of high specularity and a manufacturing method of the mold base are provided, and furthermore, a manufacturing method of a mold which includes the mold base and a mold which includes the mold base are provided. Using the mold according to an embodiment of the present invention enables production of an antireflection film which does not have an undesirable haze.

BRIEF DESCRIPTION OF DRAWINGS

FIGS. 1 (a) and (b) are a schematic view of a sputtering apparatus for formation of an aluminum alloy layer included in a mold base of an embodiment of the present invention and a cross-sectional view of an aluminum alloy layer formed on a substrate.

FIG. 2 The results of observation by SEM and AFM of a surface of an aluminum alloy layer (nitrogen gas flow rate during film formation: 0 sccm).

FIGS. 7 (a) and (b) are the results of observation by SEM and AFM of a surface of a pure aluminum layer (nitrogen gas flow rate during film formation: 0 sccm).

FIGS. 8 (a) and (b) are the results of observation by SEM and AFM of a surface of a pure aluminum layer (nitrogen gas flow rate during film formation: 10 sccm).

FIG. 10A A table that shows data (400 nm to 526 nm) used for making the graph of FIG. 9.

FIG. 10B A table that shows data (528 nm to 654 nm) used for making the graph of FIG. 9.

FIG. 10C A table that shows data (656 nm to 700 nm) used for making the graph of FIG. 9 and averages.

FIG. 11 A table that shows the NHT hardness, Hv hardness, Young's modulus, and maximum indenter depth of an aluminum alloy layer for the cases where the nitrogen gas flow rates during film formation are 0 sccm, 5 sccm, 10 sccm, 15 sccm, and 20 sccm.

FIG. 12 A table that shows the film thickness and resistance value of an aluminum alloy layer for the cases where the nitrogen gas flow rates during film formation are 5 sccm, 10 sccm, 15 sccm, and 20 sccm.

FIG. 13 A table that shows the results of composition analysis by ESCA for the case where no nitrogen gas was mixed during film formation and the cases where the nitrogen gas was mixed during film formation.

FIG. 14 (a) is a schematic diagram showing a mold base 10 for use in manufacture of a mold of an embodiment of the present invention. (b) is a schematic diagram showing a moth-eye mold 100 manufactured using the mold base 10.

FIGS. 19 (a) and (b) are schematic diagrams for illustrating a method of manufacturing a plurality of cylindrical mold bases.

FIG. 30 A table that shows the results of composition analysis on porous alumina layers (without nitrogen, nitrogen flow rate: 10 sccm, 15 sccm, 20 sccm).

FIG. 31 SEM images of an aluminum alloy layer of a comparative example. (a) is a surface SEM image (×50000; the overall length of the bar shown in the image is 100 μm). (b) is a cross-sectional SEM image.

FIG. 33 (a) is an example of a SEM image of an antireflection film which was produced using a moth-eye mold of an embodiment of the present invention. (b) is an example of a SEM image of an antireflection film of a comparative example.

DESCRIPTION OF EMBODIMENTS

Figure 3:
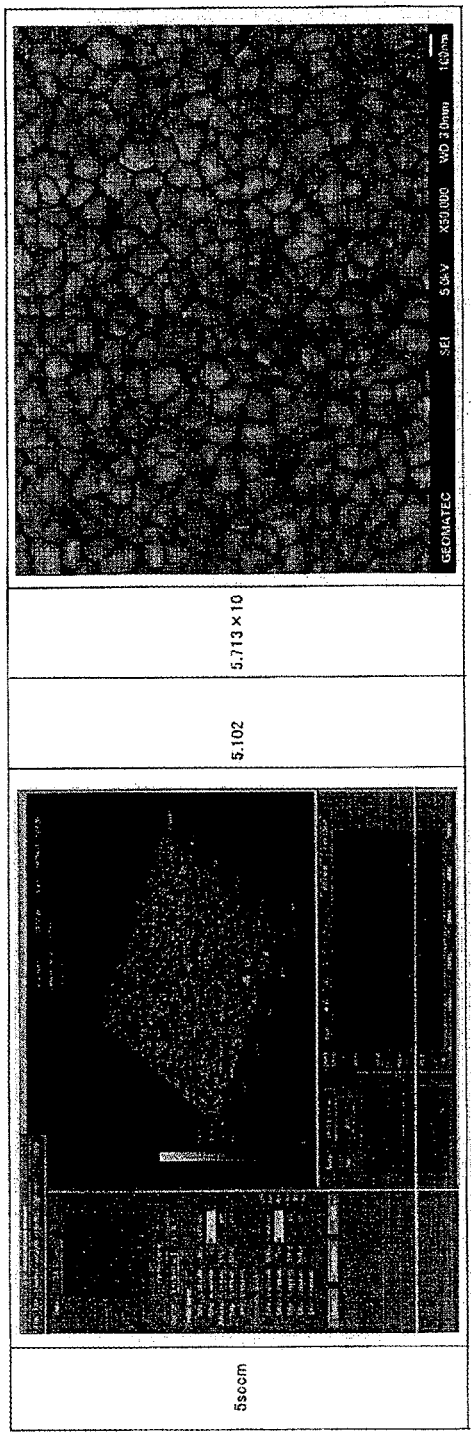
FIG. 3 The results of observation by SEM and AFM of a surface of an aluminum alloy layer (nitrogen gas flow rate during film formation: 5 sccm).

Hereinafter, a mold base, a mold base manufacturing method, a mold manufacturing method, and a mold according to embodiments of the present invention will be described with reference to the drawings. A mold of an embodiment, which will be described below as an example, is a moth-eye mold which has an inverted moth-eye structure over its surface. The mold includes a porous alumina layer which has a plurality of recessed portions whose two-dimensional size viewed in the normal direction of the surface is not less than 10 nm and less than 500 nm. An antireflection film producing method with the use of a mold of an embodiment of the present invention will also be described.

<Aluminum Alloy Layer>

First, an aluminum alloy layer included in a mold base of an embodiment of the present invention and a formation method thereof are described.

FIG. 1(a) is a schematic view of a DC magnetron sputtering apparatus for formation of an aluminum alloy layer (hereinafter, simply referred to as "sputtering apparatus 1"). The sputtering apparatus 1 includes an evacuatable chamber 2. There is a stage 4 at the bottom of the chamber 2. On the ceiling, there is an aluminum alloy target which is made of, for example, Al—Ti, Al—Nd, or the like (hereinafter, simply referred to as "target 3").

The chamber 2 has a gas inlet 6 connected to an unshown gas supply system and a gas outlet 7 connected to an unshown vacuum pump.

When forming a film of an aluminum alloy layer on the upper surface of a substrate 5 which is made of glass, for example, using the sputtering apparatus 1 that has the above-described configuration, a vacuum is created in the chamber 2 (or the chamber 2 is decompressed) by a vacuum pump (not shown), and thereafter, while the vacuum state is maintained, the substrate 5 which has an exposed surface is carried into the chamber 2 and placed on the top surface of the stage 4 such that a surface of the substrate 5 on which the film is to be formed faces to the target 3.

A sputtering gas (Ar gas) and a nitrogen gas ($N_2$ gas) are supplied into the chamber 2 via the gas inlet 6. Specifically, for example, the flow rate of the sputtering gas (Ar gas) is not less than 400 sccm and not more than 440 sccm, and the flow rate of the nitrogen gas is not less than sccm and not more than 20 sccm such that the volume fraction of the nitrogen gas to the total sputtering gas volume (=(nitrogen gas flow rate/(sputtering gas flow rate+nitrogen gas flow rate))) is not less than 1% and not more than 5%.

At the timing when the pressure inside the chamber 2 is stable in the range of not less than 0.3 Pa and not more than 0.4 Pa, for example, a DC voltage is applied to the target 3 for sputtering. In the sputtering, the temperature of the substrate 5 is maintained at 100° C., for example, and an aluminum alloy layer is formed on the surface of the substrate 5 at that maintained temperature. If the substrate temperature increases to 150° C. or higher, the effects of the nitrogen gas decrease according to the increase of the temperature, and crystal grains enlarge undesirably.

At the timing when the film thickness of the aluminum alloy layer reaches a predetermined value within the range of not less than 500 nm and not more than 1000 nm, application of the DC voltage and supply of the sputtering gas are ended, and the substrate 5 is brought out of the chamber 2.

FIG. 1(b) shows a cross-sectional view of the substrate 5 brought out of the chamber 2. On the upper surface of the substrate 5, there is an aluminum alloy layer 8 whose film thickness is in the range of not less than 500 nm and not more than 1000 nm. The aluminum alloy layer 8 is made of Al—Ti, Al—Nd, or the like. The aluminum alloy layer 8 that contains Ti or Nd scarcely contains abnormal grains.

In experimental examples which will be described later, the film formation conditions for the aluminum alloy layer or pure aluminum layer are, unless otherwise specified, such that the flow rate of the sputtering gas (Ar gas) is 440 sccm, and the vacuum degree during sputtering is 0.4 Pa. The effects of the rate of content of nitrogen in the aluminum alloy layer or pure aluminum layer were examined where the flow rate of the nitrogen gas was varied between 0 sccm and 20 sccm (i.e., the volume fraction of the nitrogen gas to the total sputtering gas volume was varied between 0% and 4.3%).

Figure 2:
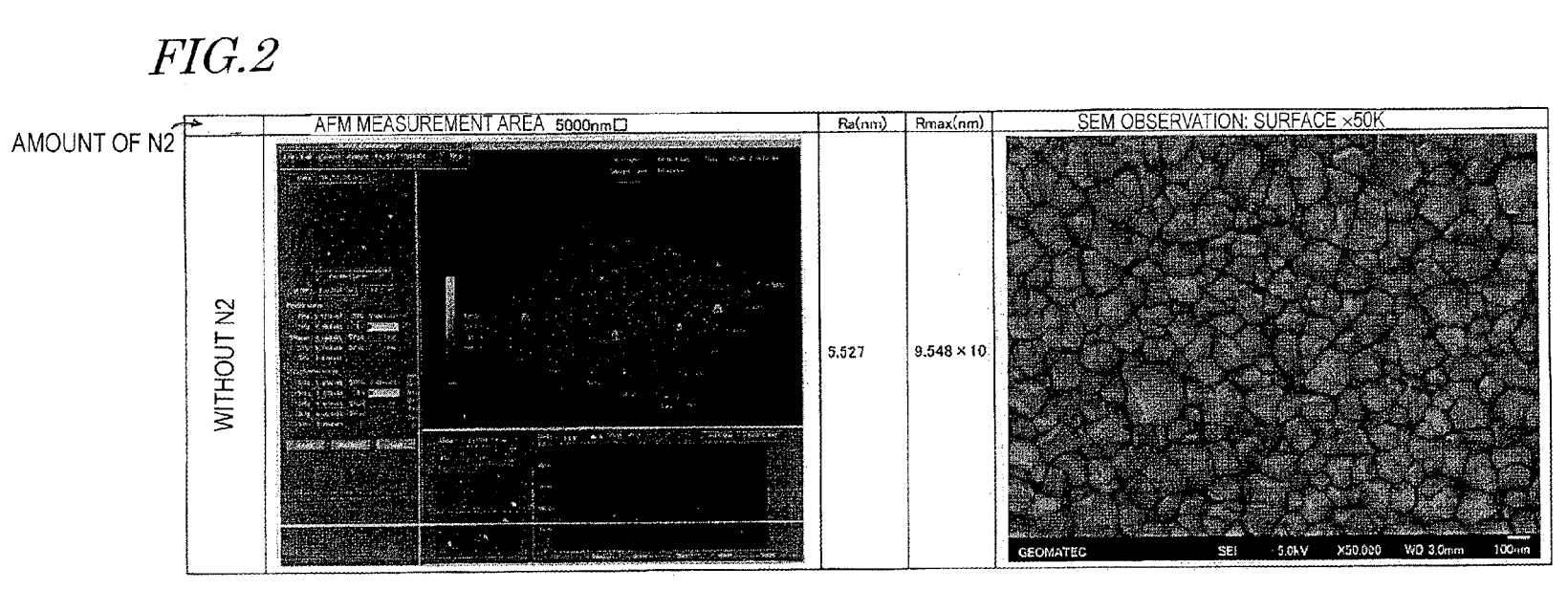

Examples of the above-described aluminum alloy layer 8 were formed at five nitrogen gas levels in total: the amount of the mixed nitrogen gas was increased stepwise from the first level where no nitrogen gas was mixed. The state of the surface of the resultant aluminum alloy layers 8 is shown in FIG. 2 to FIG. 6.

FIG. 2 to FIG. 6 show the result of AFM (Atomic Force Microscope) observation (left) and the result of SEM (Scanning Electron Microscope) observation (right) of the surface of the aluminum alloy layer 8. The scanning region of AFM was a square region of 5000 nm on each side. The magnification of SEM was ×50000. Note that the film thickness of the aluminum alloy layer 8 was about 1000 nm.

As for FIG. 2, the aluminum alloy layer 8 was formed with no nitrogen gas mixed. It is seen from the left part of FIG. 2 that relatively large raised portions are sparsely present. It is seen from the right part of FIG. 2 that aluminum grains formed are relatively large. The average surface roughness Ra of this aluminum alloy layer is 5.527 nm. The maximum surface roughness Rmax of this aluminum alloy layer is 9.548×10 nm. Here, the aluminum grains shown in FIG. 2 have an average grain diameter of greater than 100 nm (see the scale of 100 nm at the right lower portion of the right part of FIG. 2).

As for FIG. 3, the aluminum alloy layer 8 was formed with the nitrogen gas mixed (flow rate: 5 sccm). It is seen from the left part of FIG. 3 that the number of relatively large raised portions is smaller than in the case of FIG. 2. It is seen from the right part of FIG. 3 that aluminum grains formed are somewhat smaller than in the case of FIG. 2. The average surface roughness Ra is 5.102 nm. The maximum surface roughness Rmax is 5.713×10 nm. Here, the aluminum grains shown in FIG. 3 have a smaller average grain diameter than in the case of FIG. 2, and specifically have an average grain diameter of not more than 100 nm.

Figure 4:
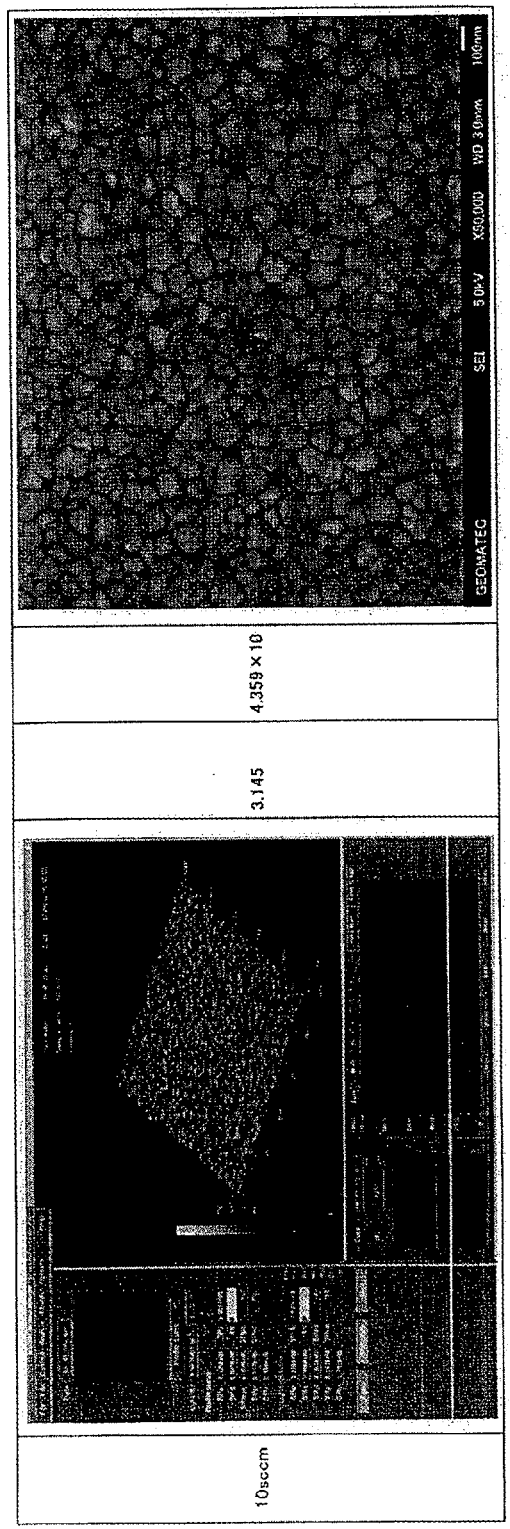
FIG. 4 The results of observation by SEM and AFM of a surface of an aluminum alloy layer (nitrogen gas flow rate during film formation: 10 sccm).

As for FIG. 4, the aluminum alloy layer 8 was formed with the nitrogen gas mixed (flow rate: 10 sccm). It is seen from the left part of FIG. 4 that the number of relatively large raised portions is smaller than in the case of FIG. 3. It is seen from the right part of FIG. 4 that aluminum grains formed are somewhat smaller than in the case of FIG. 3. The average surface roughness Ra is 3.145 nm. The maximum surface roughness Rmax is 4.359×10 nm. Here, the aluminum grains shown in FIG. 4 have a smaller average grain diameter than in the case of FIG. 3, and specifically have an average grain diameter of not more than 100 nm.

Figure 5:
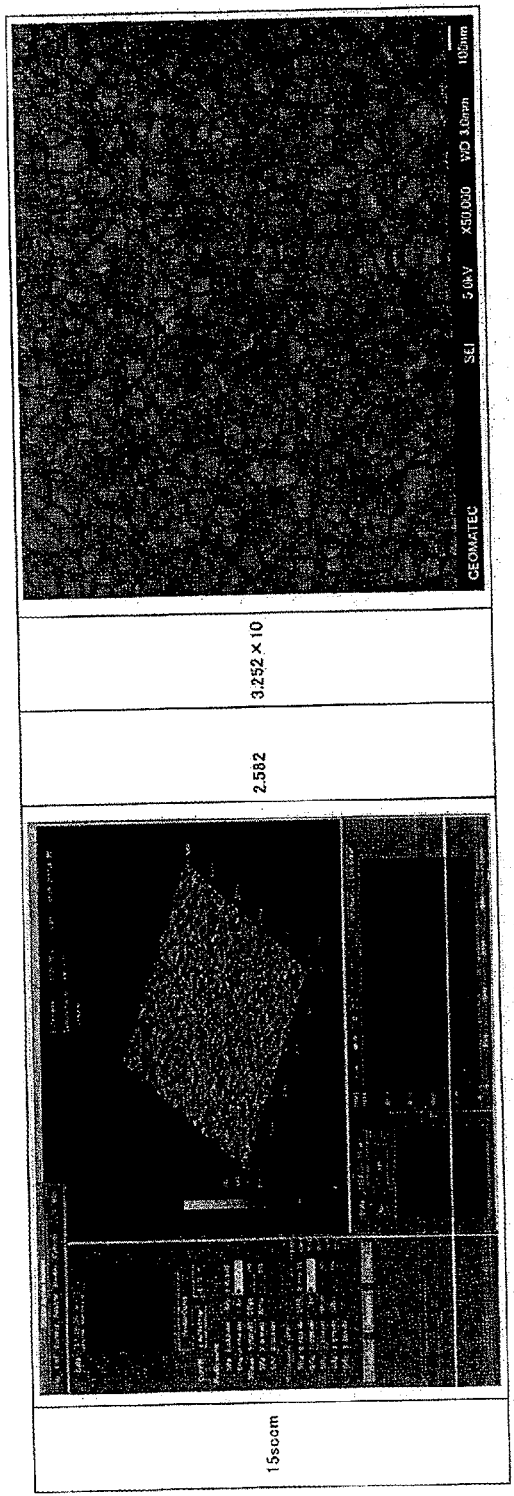
FIG. 5 The results of observation by SEM and AFM of a surface of an aluminum alloy layer (nitrogen gas flow rate during film formation: 15 sccm).

As for FIG. 5, the aluminum alloy layer 8 was formed with the nitrogen gas mixed (flow rate: 15 sccm). It is seen from the left part of FIG. 5 that the number of relatively large raised portions is smaller than in the case of FIG. 4. It is seen from the right part of FIG. 5 that aluminum grains formed are somewhat smaller than in the case of FIG. 4. The average surface roughness Ra is 2.582 nm. The maximum surface roughness Rmax is 3.252×10 nm. Here, the aluminum grains shown in FIG. 5 have a smaller average grain diameter than in the case of FIG. 4, and specifically have an average grain diameter of not more than 100 nm.

Figure 6:
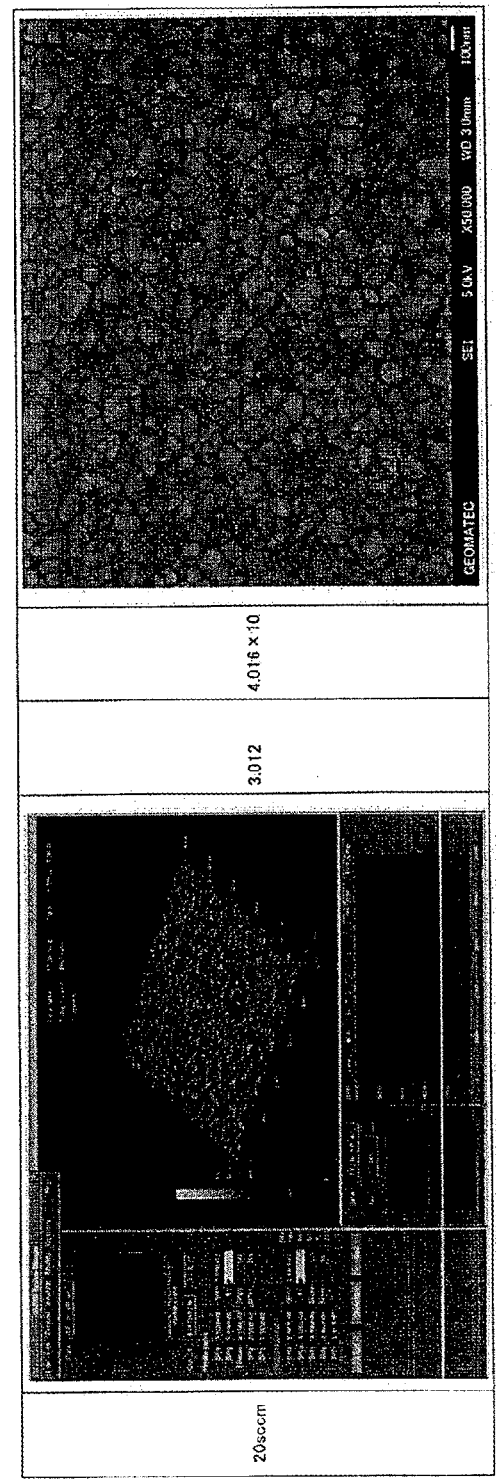
FIG. 6 The results of observation by SEM and AFM of a surface of an aluminum alloy layer (nitrogen gas flow rate during film formation: 20 sccm).

As for FIG. 6, the aluminum alloy layer 8 was formed with the nitrogen gas mixed (flow rate: 20 sccm). In this case, it is seen from the left part of FIG. 6 that the number of relatively large raised portions is greater than in the case of FIG. 5. The average surface roughness Ra is 3.012 nm. The maximum surface roughness Rmax is 4.016×10 nm. As seen from the comparison with FIG. 5, the variation in size of the grains increases and the uniformity deteriorates, although the effect of decreasing the grain size is maintained. Therefore, it is concluded that the nitrogen gas flow rate of 20 sccm is somewhat greater than the optimum value.

As described above, it is seen from FIG. 2 through FIG. 6 that when the aluminum alloy layer 8 is formed with the nitrogen gas mixed at a flow rate of not less than 5 sccm and not more than 20 sccm, the diameter of aluminum grains decreases. In this case, the average grain diameter of crystal grains viewed in the normal direction of the aluminum alloy layer 8 is not more than 100 nm, and the maximum surface roughness Rmax is not more than 60 nm. This configuration improves the optical reflectance of the surface of the aluminum alloy layer 8.

Here, in FIG. 1, the aluminum alloy layer 8 that is made of, for example, Al—Ti, Al—Nd, or the like, is to be formed on the upper surface of the substrate 5, and the present invention excludes formation of a pure aluminum layer. This is because it is already known that, although decrease of the diameter of aluminum grains is achieved by addition of nitrogen even in the case of a pure aluminum layer, occurrence of abnormally large grains cannot be avoided in that case.

FIG. 7 and FIG. 8 show the results of observation by AFM and SEM of a surface of a so-called pure aluminum layer formed on the upper surface of the substrate 5, as shown in FIG. 2 through FIG. 6. In FIG. 7 and FIG. 8, (a) is the result of AFM where the scanning region is a square region of 5000 nm on each side, and (b) is the result of SEM observation of the pure aluminum layer surface shown in (a). FIG. 7 shows the results of the case where the pure aluminum layer was formed with no nitrogen gas mixed. FIG. 8 shows the results of the case where the pure aluminum layer was formed with the nitrogen gas mixed (flow rate: 10 sccm).

As seen from FIG. 7, in the case of the nitrogen-free pure aluminum layer, the average surface roughness Ra is 8.985 nm, and the maximum surface roughness Rmax is 2.001×10² nm. It can be seen that these surface roughness values (particularly, the maximum surface roughness) are large (see FIG. 7(b)). As seen from FIG. 8, even in the case of the nitrogen-containing pure aluminum layer, the average surface roughness Ra is 6.501 nm, and the maximum surface roughness is 1.958×10² nm. It can be seen that these surface roughness values (particularly, the maximum surface roughness) are large (see FIG. 8(b)). As seen from these results, from the viewpoint of globally decreasing the size of aluminum grains and thereby achieving high reflectance, the aluminum alloy layer is preferable to the pure aluminum layer.

Figure 9:
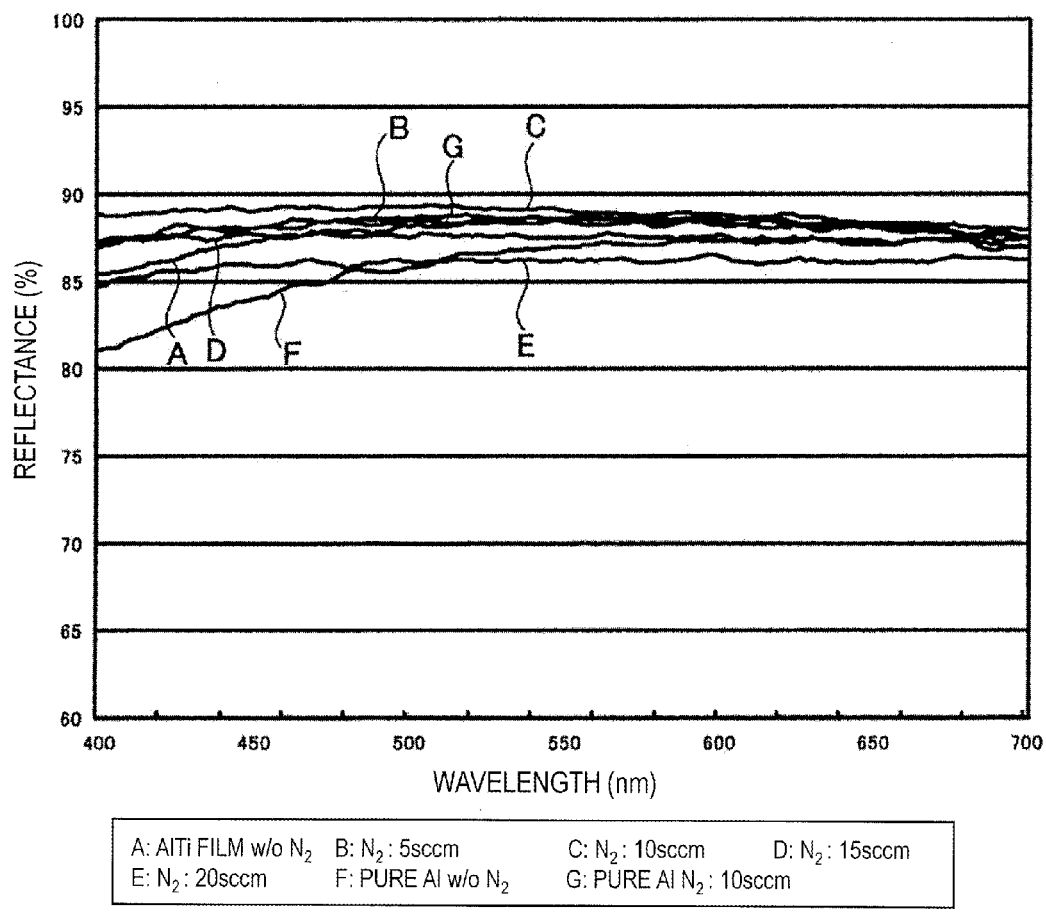
FIG. 9 A graph that shows the reflectance (%) of a nitrogen-containing aluminum alloy layer 8, together with the reflectances of a nitrogen-free aluminum alloy layer, a nitrogen-free pure aluminum layer, and a nitrogen-containing pure aluminum layer, with respect to the wavelength (nm) of light.

FIG. 9 is a graph that shows the reflectance (%) of the above-described nitrogen-containing aluminum alloy layer 8, together with the reflectances of a nitrogen-free aluminum alloy layer, a nitrogen-free pure aluminum layer, and a nitrogen-containing pure aluminum layer, with respect to the wavelength (nm) of light. In this graph, the horizontal axis represents the wavelength (nm) of light, and the vertical axis represents the reflectance (%).

In FIG. 9, graph A represents the reflection characteristic of the nitrogen-free aluminum alloy layer; graph B represents the reflection characteristic of the nitrogen-containing aluminum alloy layer (nitrogen gas flow rate during film formation: 5 sccm); graph C represents the reflection characteristic of the nitrogen-containing aluminum alloy layer (nitrogen gas flow rate during film formation: 10 sccm); graph D represents the reflection characteristic of the nitrogen-containing aluminum alloy layer (nitrogen gas flow rate during film formation: 15 sccm); graph E represents the reflection characteristic of the nitrogen-containing aluminum alloy layer (nitrogen gas flow rate during film formation: 20 sccm); graph F represents the reflection characteristic of the nitrogen-free pure aluminum layer; and graph G represents the reflection characteristic of the nitrogen-containing pure aluminum layer (nitrogen gas flow rate during film formation: 10 sccm). FIGS. 10A to 10C are tables that show data used for making the graph of FIG. 9. FIG. 10A, FIG. 10B, and FIG. 10C show the reflectances of the above-described layers of graphs A, B, C, D, E, F, and G for wavelength ranges of 400 to 526 nm, 528 to 668 nm, and 670 to 700 nm, respectively.

As seen from FIG. 9 and FIGS. 10A to 10C, at least in the case of the nitrogen-containing aluminum alloy layer, as for the optical reflectances for the visible range wavelengths, 400 to 700 nm, even the lowest reflection characteristic (graph E) is not less than 86% on average. That is, achieved reflectances are higher than those of the nitrogen-free aluminum layer (graph F), particularly in a region near 400 nm. Note that, however, the reason that the nitrogen-containing aluminum alloy layer E (nitrogen gas flow rate during film formation: 20 sccm) exhibits lower reflectances than the nitrogen-free aluminum alloy layer A is not clear, although as previously described with reference to FIG. 2 through FIG. 6, the nitrogen-containing aluminum alloy layer (nitrogen gas flow rate during film formation: 20 sccm) has better surface flatness and surface structure uniformity than the nitrogen-free aluminum alloy layer. Note that, even in the case of the pure aluminum layer, addition of nitrogen improves the reflectance (see graph G), but the previously-described abnormal grains are more likely to occur than in the aluminum alloy layers.

FIG. 11 is a table that shows the NHT hardness, the Vickers hardness Hv converted from the NHT hardness, the Young's modulus, and the maximum indenter depth of the above-described aluminum alloy layer 8 for the cases where no nitrogen gas was mixed or the nitrogen gas was mixed at 5 sccm, 10 sccm, 15 sccm, or 20 sccm in the sputtering gas (Ar gas, flow rate: 440 sccm) in formation of the aluminum alloy layer 8. Note that the NHT hardness refers to a hardness which is measured using a Nano Hardness Tester according to a method compliant with ISO 14577.

The Vickers hardness number is 96.6 when no nitrogen gas is mixed, while when the nitrogen gas is mixed at 5 sccm, 10 sccm, 15 sccm, and 20 sccm, the Vickers hardness numbers are 155.8, 194.7, 225.7, and 229.2, respectively. That is, the Vickers hardness number increases according to the amount of the mixed nitrogen gas. It can be seen from this that the aluminum alloy layer 8 has high hardness when nitrogen is contained.

The Young's modulus is 73.9 GPa when no nitrogen gas is mixed, while when the nitrogen gas is mixed at 5 sccm, 10 sccm, 15 sccm, and 20 sccm, the Young's moduli are 78.0 GPa, 77.7 GPa, 95.3 GPa, and 82.5 GPa, respectively. It can be seen that the Young's modulus generally increases according to the amount of the mixed nitrogen gas.

The maximum indenter depth is 193.7 nm when no nitrogen gas is mixed, while when the nitrogen gas is mixed at 5 sccm, 10 sccm, 15 sccm, and 20 sccm, the maximum indenter depth decreases to 154.1 nm, 140.7 nm, 130.4 nm, and 131.2 nm, respectively. It can be seen that the hardness of the aluminum alloy layer 8 increases according to the amount of the mixed nitrogen gas.

Thus, it can be seen that the aluminum alloy layer 8 has extremely high hardness and durability when nitrogen is contained.

The table of FIG. 11 shows that the adherence test of the aluminum alloy layer 8 to the substrate 5 was carried out based on Vickers indentations and scratches. In every case, no separation was found.

FIG. 12 is a table that shows the relationship between the film thickness and the resistance value of the aluminum alloy layer 8 which was formed with the nitrogen gas mixed at flow rates of 5 sccm, 10 sccm, 15 sccm, and 20 sccm in the sputtering gas during formation of the film.

When the film thickness of the aluminum alloy layer 8 formed with the nitrogen gas mixed at 5 sccm is 783 nm, 791 nm, and 808 nm, the resistance values are 0.1005 Ω, 0.0970Ω, and 0.0944Ω, respectively. Accordingly, the average film thickness of the aluminum alloy layer 8 is 796.05 nm, the average resistance value is 0.0975Ω, and the specific resistance is 7.758 μΩcm.

When the film thickness of the aluminum alloy layer 8 formed with the nitrogen gas mixed at 10 sccm is 742 nm, 741 nm, and 766 nm, the resistance values are 0.1366 Ω, 0.1314Ω, and 0.1275Ω, respectively. Accordingly, the average film thickness of the aluminum alloy layer 8 is 754.70 nm, the average resistance value is 0.1321Ω, and the specific resistance is 9.966 μΩcm.

When the film thickness of the aluminum alloy layer 8 formed with the nitrogen gas mixed at 15 sccm is 766 nm, 788 nm, and 790 nm, the resistance values are 0.1775 Ω, 0.1675Ω, and 0.1645Ω, respectively. Accordingly, the average film thickness of the aluminum alloy layer 8 is 778.75 nm, the average resistance value is 0.1710Ω, and the specific resistance is 13.317 μΩcm.

When the film thickness of the aluminum alloy layer 8 formed with the nitrogen gas mixed at 20 sccm is 736 nm, 748 nm, and 763 nm, the resistance values are 0.2392 Ω, 0.2152Ω, and 0.2225Ω, respectively. Accordingly, the average film thickness of the aluminum alloy layer 8 is 749.90 nm, the average resistance value is 0.2309Ω, and the specific resistance is 17.311 μΩcm.

When the film thickness of the aluminum alloy layer 8 formed with no nitrogen gas mixed is 659 nm, 665 nm, and 674 nm, the resistance values are 0.0839 Ω, 0.0839Ω, and 0.0826Ω, respectively. Accordingly, the average film thickness of the aluminum alloy layer 8 is 6669.00, the average resistance value is 0.0833, and the specific resistance is 5.552 μΩcm.

As clearly seen from this table, the specific resistance of the aluminum alloy layer 8 is, at least, not more than 20 μΩ even when nitrogen is contained in the aluminum alloy layer 8. Therefore, the aluminum alloy layer 8 is sufficiently applicable to wiring layers or the like of electronic components and, for example, can be used as an electrode of an organic EL (Electro Luminescence) device.

FIG. 13 is a table that shows the results of composition analysis by ESCA (Electron Spectroscopy for Chemical Analysis) for the case where no nitrogen gas was mixed in formation of the aluminum alloy layer 8, the case where the nitrogen gas was mixed at 5 sccm, the case where the nitrogen gas was mixed at 10 sccm, the case where the nitrogen gas was mixed at 15 sccm, and the case where the nitrogen gas was mixed at 20 sccm. In FIG. 13, the subjects of the composition analysis are O, Ti, N, Al, and C. In the measurement, a photoelectron spectrometer JPS-9000MC manufactured by JEOL Ltd. was used.

As seen from this table, when the nitrogen gas is mixed at 5 sccm, the nitrogen content of the aluminum alloy layer is not less than 0.5 mass % and not more than 0.9 mass %. When the nitrogen gas is mixed at 20 sccm, the nitrogen content of the aluminum alloy layer is not less than 2.2 mass % and not more than 5.7 mass %.

Thus, a nitrogen-containing aluminum alloy layer whose nitrogen content is not less than 0.5 mass % and not more than 5.7 mass % has better flatness (the maximum surface roughness Rmax is not more than 60 nm) and better surface structure uniformity (the average grain diameter of crystal grains is not more than 100 nm) than a nitrogen-free aluminum alloy layer (see FIG. 2 through FIG. 6).

When the nitrogen gas is mixed at 20 sccm, the reflectance of the resultant aluminum alloy layer is smaller than the others. Therefore, when the film thickness of the aluminum alloy layer 8 is in the range of not less than 500 nm and not more than 1000 nm, it is preferred from the viewpoint of achieving higher reflectance that the nitrogen content of the aluminum alloy layer 8 is in the range of not less than 0.5 mass % and not more than 4.1 mass % (see FIG. 9 and FIGS. 10A to 10C).

As seen from the above table, when Ti is contained in the aluminum alloy layer as the non-aluminum metal element, the content of Ti is not less than 1.0 mass % and not more than 1.9 mass %, and this value is suitable.

In the above description, the non-aluminum metal element added to the aluminum alloy layer is Ti or Nd, although it is not limited to these examples. It may be such a different metal element that the absolute value of the difference between the standard electrode potential of the metal element and the standard electrode potential of aluminum is not more than 0.64 V (for example, Mn, Mg, Zr, V, and Pb). As disclosed in the above-identified international patent application (PCT/JP2012/058394), containment of the metal element M prevents abnormal growth of crystal grains of aluminum, and as a result, the aluminum alloy layer 8 scarcely contains abnormal grains. The metal element may be Mo, Nb, or Hf. The aluminum alloy layer may contain two or more of these metal elements.

<Mold Base, Mold Base Manufacturing Method, Moth-Eye Mold Manufacturing Method, and Moth-Eye Mold>

Next, a mold base, a mold base manufacturing method, a moth-eye mold manufacturing method, and a moth-eye mold according to embodiments of the present invention are described. The mold base of the embodiment which will be described as an example is to be used for manufacture of a moth-eye mold configured for production of an antireflection film. As described above, a moth-eye mold in the form of a cylinder (roll) is capable of efficiently producing an antireflection film according to a roll-to-roll method. An example of the mold base in the form of a cylinder will be described later.

First, a mold manufacturing method according to an embodiment of the present invention is described.

The mold manufacturing method of the embodiment of the present invention includes the step of preparing a mold base 10 which includes a metal base 72m, an organic insulating layer 13 formed on the metal base 72m, and an aluminum alloy layer 18 formed on the organic insulating layer 13 as shown in FIG. 14(a). The metal base 72m and the organic insulating layer 13 are sometimes integrally referred to as "support 12". Note that the metal base 72m may be replaced by a different base (e.g., an insulative base such as a glass base). The organic insulating layer 13 may be omitted. However, when using a base of a metal which is different from the aluminum alloy layer 18, the aluminum alloy layer 18 and the metal base 72m are preferably electrically insulated from each other in order to prevent occurrence of electrochemical corrosion between these elements. Therefore, it is preferred to provide an organic insulating layer and/or inorganic underlayer between the metal base 72m and the aluminum alloy layer 18. Note that, when an insulative base is used, an organic insulating layer and/or inorganic underlayer may also be provided. The organic insulating layer and/or inorganic underlayer provide the effect of improving the adhesive property between the aluminum alloy layer and the base. Providing a buffer layer between the inorganic underlayer and the aluminum alloy layer further improves the adhesive property.

The aluminum alloy layer 18 used herein is the same as the above-described aluminum alloy layer 8. That is, the aluminum alloy layer 18 contains aluminum, a non-aluminum metal element M, and nitrogen.

It is preferred that the average grain diameter of crystal grains that form the aluminum alloy layer 18 when viewed in the normal direction of the aluminum alloy layer 18 is not more than 100 nm, and that the maximum surface roughness Rmax of the aluminum alloy layer 18 is not more than 60 nm. The content of nitrogen in the aluminum alloy layer 18 is preferably not less than 0.5 mass % and not more than 5.7 mass %.

It is preferred that the absolute value of the difference between the standard electrode potential of the metal element M and the standard electrode potential of aluminum is not more than 0.64 V, and that the content of the metal element M in the aluminum alloy layer 18 is not less than 1.0 mass % and not more than 1.9 mass %. The metal element M is Ti or Nd. The metal element M is not limited to these examples but may be such a different metal element that the absolute value of the difference between the standard electrode potential of the metal element M and the standard electrode potential of aluminum is not more than 0.64 V (for example, Mn, Mg, Zr, V, and Pb). The aluminum alloy layer may contain two or more of these metal elements.

As will be described later with the illustration of an experimental example, the aluminum alloy layer 18 which contains the above-described metal element M and nitrogen has a reflectance of not less than 86% in the visible light range, for example, the wavelength range of 400 nm to 700 nm. That is, containment of the metal element M prevents abnormal growth of crystal grains of aluminum, and containment of nitrogen leads to reduction in size of the crystal grains. As a result, the aluminum alloy layer 18 has small surface roughness, and formation of voids between the crystal grains is prevented.

Therefore, by forming the moth-eye mold 100 which has a porous alumina layer 20 such as shown in FIG. 14(b) with the use of the aluminum alloy layer 18, a mold 100 can be obtained which is capable of forming an antireflection film that does not have an undesirable haze (a haze-free antireflection film or a haze-controlled antireflection film).

Now, the reason of production of an antireflection film which has an undesirable haze is briefly described with reference to FIG. 31 and FIG. 32. FIG. 31 shows SEM images of an aluminum alloy layer of a comparative example. FIG. 31(a) is a surface SEM image (×50000; the overall length of the bar shown in the image is 100 μm). FIG. 31(b) is a cross-sectional SEM image. This aluminum alloy layer is an Al—Ti layer and has a thickness of about 1000 nm. The composition of the target is Al: 99.5 mass % and Ti: 0.5 mass %. This aluminum alloy layer was formed according to a method (comparative example) disclosed in PCT/JP2012/058394. As seen from these SEM images, voids are sparsely present.

FIGS. 32(a) to 32(d) are schematic diagrams for illustrating the reason why presence of voids in the aluminum alloy layer leads to production of an antireflection film which has an undesirable haze.

When an aluminum alloy layer 78 which has a void 78b as shown in FIG. 32(a) is anodized, a plurality of minute recessed portions are formed inside the void 78b as shown in FIG. 32(b) during formation of a porous alumina layer 80 which has minute recessed portions 82a. The void 78b and the plurality of minute recessed portions formed inside the void 78b are herein generically referred to as "abnormal recessed portions 82b".

Thereafter, the step of enlarging the minute recessed portions 82 by etching and the step of growing the minute recessed portions 82a by another anodization process are carried out. As a result, the abnormal recessed portions 82b enlarge as shown in FIG. 32(c).

When an antireflection film is produced using a mold which has the porous alumina layer 80 such as shown in FIG. 32(c), coarse raised portions 92b which correspond to the abnormal recessed portions 82b are formed as shown in FIG. 32(d). Minute raised portions 92a which correspond to the normal minute recessed portions 82a of the porous alumina layer 80 have, for example, a conical shape and perform an antireflection function.

FIG. 33 shows examples of SEM images of prototypal antireflection films (×50000; the overall length of the scale shown in the image is 500 nm). FIG. 33(a) is an example of a SEM image of an antireflection film which was produced using a moth-eye mold of an embodiment of the present invention. FIG. 33(b) is an example (comparative example) of a SEM image of an antireflection film produced according to a method disclosed in PCT/JP2012/058394.

Figure 32:
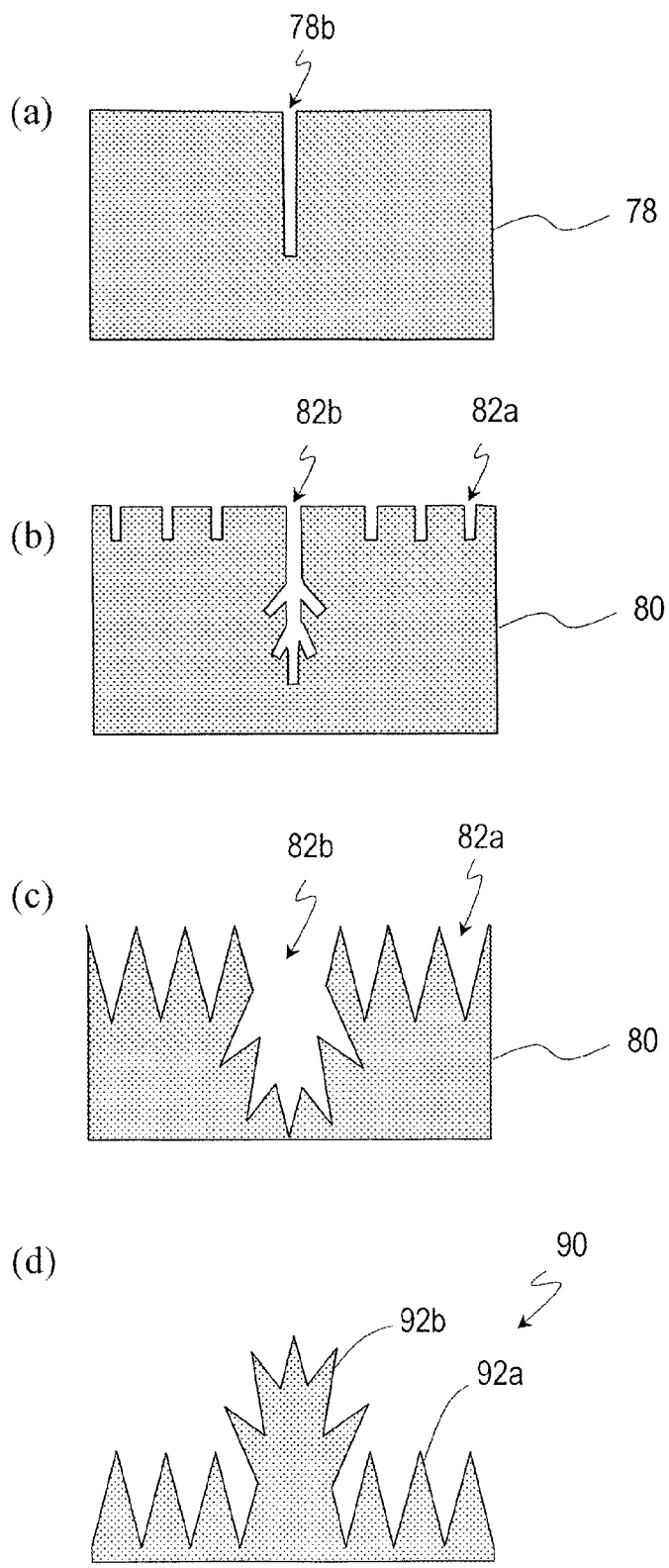
FIG. 32 (a) to (d) are schematic diagrams for illustrating the reason why presence of voids in an aluminum alloy layer leads to production of an antireflection film which has an undesirable haze.

In FIG. 33(b), there are large raised portions which are considered to correspond to the coarse raised portions 92b shown in FIG. 32(d). The two-dimensional size of the large raised portions when viewed in a direction normal to the film is approximately 300 nm. The size of these large raised portions can be generally explained based on the model that has been described with reference to FIG. 32.

The thickness of the aluminum alloy layer is preferably not less than 500 nm and not more than 1000 nm. This is because the depth of recessed portions of a moth-eye mold configured for production of an antireflection film is not less than about 10 nm, typically not less than 100 nm and less than about 1000 nm (about 1 μm).

Here, the aluminum alloy layer 18 having a thickness of about 1 μm is preferably formed through a plurality of separate cycles rather than formed at once in one cycle. Specifically, it is preferred to repeat the cycle of depositing aluminum to a certain thickness before an intermission of a certain time period and resuming the deposition after the intermission till the aluminum alloy layer 18 having a predetermined thickness (e.g., 1 μm) is obtained, rather than to continuously deposit aluminum to the predetermined thickness. For example, it is preferred that the aluminum alloy layer 18 having a thickness of about 1 μm is obtained by forming 20 aluminum alloy layers each of which has a thickness of 50 nm in such a manner that every formation of the 50 nm thick aluminum alloy layer is followed by an intermission. In this way, the deposition of the aluminum alloy is carried out in a plurality of separate cycles, whereby the quality of the finally-obtained aluminum alloy layer 18 (e.g., the chemical resistance or adhesion) can be improved. This is probably because continuous deposition of the aluminum alloy increases the temperature of a base (a base having a surface on which the aluminum layer is to be formed), and as a result, the distribution of thermal stress in the aluminum alloy layer 18 becomes nonuniform so that the film quality deteriorates.

Here, it is preferred to provide an inorganic underlayer 14 between the organic insulating layer 13 and the aluminum alloy layer 18 as in the mold base 10 shown in FIG. 1(a). The inorganic underlayer 14 is directly provided on a surface of the organic insulating layer 13 and functions to improve adhesion between the organic insulating layer 13 and the aluminum alloy layer 18. The inorganic underlayer 14 is preferably made of an inorganic oxide or an inorganic nitride. When an inorganic oxide is used, for example, the inorganic underlayer 14 is preferably a silicon oxide layer, a tantalum oxide layer, or a titanium oxide layer. When an inorganic nitride is used, for example, the inorganic underlayer 14 is preferably a silicon nitride layer. Further, the thermal expansion coefficient of the inorganic underlayer 14 may be adapted by adding an impurity to the inorganic oxide layer or inorganic nitride layer. For example, when a silicon oxide layer is used, the thermal expansion coefficient can be increased by adding germanium (Ge), phosphorus (P), or boron (B).

The thickness of the inorganic underlayer 14 is preferably not less than 40 nm and, more preferably, not less than 100 nm. When the thickness of the inorganic underlayer is less than 40 nm, the effects of provision of the inorganic underlayer 14 are not sufficiently produced in some cases. The thickness of the inorganic underlayer 14 is preferably not more than 500 nm and, more preferably, not more than 200 nm. If the thickness of the inorganic underlayer 14 is more than 500 nm, the time required for formation of the inorganic underlayer 14 will be unduly long. When the inorganic underlayer 14 is formed on a curved surface or a flexible surface, cracks are more likely to be caused as the thickness of the inorganic underlayer 14 increases.

Preferably, the mold base 10 further includes a buffer layer 16 interposed between the inorganic underlayer 14 and the aluminum alloy layer 18. The buffer layer 16 has the function of improving the adhesive property between the inorganic underlayer 14 and the aluminum alloy layer 18. In the example described herein, the buffer layer 16 is directly provided on the inorganic underlayer 14, although the present invention is not limited to this example. For example, when an electrically-conductive layer (preferably, a valve metal layer) is provided as a backing in order to uniformly anodize the aluminum alloy layer 18, the electrically-conductive layer may be provided between the inorganic underlayer 14 and the buffer layer 16 or between the buffer layer 16 and the aluminum alloy layer 18.

The buffer layer 16 preferably contains aluminum, the metal element M, and either of oxygen or nitrogen. The buffer layer 16 preferably has such a profile that the contents of aluminum and the metal element M are higher in a portion which is closer to the aluminum alloy layer 18 than in another portion which is closer to the inorganic underlayer 14, although the oxygen or nitrogen content may be uniform. This is because the property values, such as the thermal expansion coefficient, exhibit excellent conformity. The thickness of the buffer layer 16 is preferably not less than 10 nm and, more preferably, not less than 20 nm. The thickness of the buffer layer 16 is preferably not more than 500 nm and, more preferably, not more than 200 nm. If the thickness of the buffer layer 16 is less than 10 nm, sufficient adhesion is not achieved between the inorganic underlayer 14 and the aluminum alloy layer 18 in some cases. If the thickness of the buffer layer 16 is more than 500 nm, the time required for formation of the buffer layer 16 will be unduly long. Thus, this case is not preferred.

The profile of the aluminum content in the buffer layer 16 along the thickness direction may vary stepwise or may continuously vary. For example, when the buffer layer 16 is formed of aluminum, the metal element M, and oxygen, a plurality of aluminum oxide alloy layers which have gradually decreasing oxygen contents are formed, and then, the aluminum alloy layer 18 is formed on the uppermost aluminum oxide alloy layer. The highest oxygen content in the buffer layer 16 is preferably not more than 60 at %. This also applies to a case where the buffer layer 16 formed contains nitrogen instead of oxygen.

The moth-eye mold 100 shown in FIG. 14(b) can be obtained by performing: the step of partially anodizing the aluminum alloy layer 18 with the use of the mold base 10 shown in FIG. 14(a) in the same way as the conventional method, thereby forming the porous alumina layer 20 which has a plurality of minute recessed portions 22; thereafter, the step of bringing the porous alumina layer 20 into contact with an etching solution, thereby enlarging the plurality of minute recessed portions 22 of the porous alumina layer 20, and thereafter, the step of further performing anodization to grow the plurality of minute recessed portions 22.

The moth-eye mold 100 is suitably used in production of an antireflection film (antireflection surface). The cross-sectional shape of the minute recessed portions (micropores) 22 of the porous alumina layer 20 that is to be used in production of an antireflection film is generally conical. As overdrawn in FIG. 14(b), the minute recessed portions 22 may have a stepped lateral surface. It is preferred that the two-dimensional size of the minute recessed portions 22 (opening diameter: $D_p$) is not less than nm and less than 500 nm, and the depth of the minute recessed portions 22 ($D_{depth}$) is generally not less than 10 nm and less than 1000 nm (1 μm). It is also preferred that the bottom portion of the minute recessed portions 22 is tapered (with the deepest part of the bottom portion being pointed). Further, it is preferred that the minute recessed portions 22 are in a closely packed arrangement. Assuming that the shape of the minute recessed portions 22 of the porous alumina layer 20 when viewed in a direction normal to the porous alumina layer 20 is a circle, it is preferred that adjacent circles overlap each other, and a saddle portion is formed between adjacent ones of the minute recessed portions 22. Note that, when the generally-conical minute recessed portions 22 adjoin one another so as to form saddle portions, the two-dimensional size of the minute recessed portions 22, $D_p$, is equal to the average adjoining distance $D_{int}$. Thus, the porous alumina layer 20 of the moth-eye mold 100 that is for production of the antireflection film preferably has a configuration in which the minute recessed portions 22 are in an irregular closely-packed arrangement, the minute recessed portions 22 having such dimensions that $D_p=D_{int}$ is not less than 10 nm and less than 500 nm and $D_{depth}$ is generally not less than 10 nm and less than 1000 nm (1 μm). Note that, strictly speaking, the shape of the openings of the minute recessed portions 22 is not a circle. $D_p$ is preferably determined from the SEM image of the surface. The thickness of the porous alumina layer 20, $t_p$, is not more than about 1 μm.

Hereinafter, a method for manufacturing a roll-shaped mold with the use of a mold base in the shape of a hollow cylinder is described.

The roll-shaped mold was manufactured by a method disclosed in WO 2011/105206 of the applicant of the present application. Here, a metal sleeve which was made of stainless steel or nickel was used. Note that the metal sleeve refers to a hollow cylinder which is made of a metal and which has a thickness of not less than 0.02 mm and not more than 1.0 mm. The entire disclosures of WO 2011/105206 are herein incorporated by reference.

Figure 15:
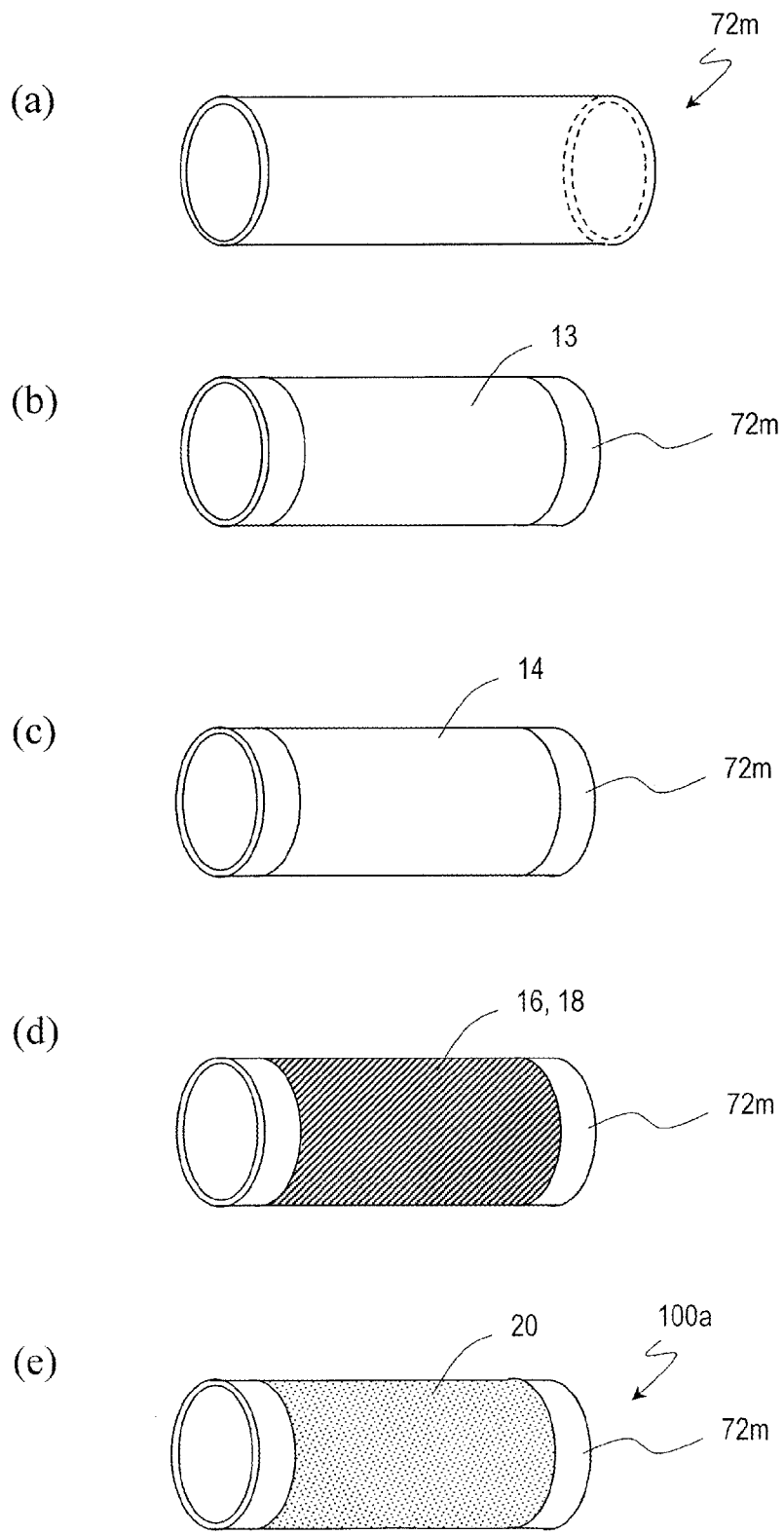
FIG. 15 (a) to (e) are diagrams showing the steps of a method for manufacturing a roll mold with the use of a metal sleeve.

A method for manufacturing a roll mold with the use of a metal sleeve used in an experiment is briefly described with reference to FIG. 15.

Firstly, a metal sleeve 72m is provided as shown in FIG. 15(a).

Then, as shown in FIG. 15(b), an organic insulating layer 13 is formed on the outer perimeter surface of the metal sleeve 72m by electrodeposition, for example.

The electrodeposition may be, for example, a known electrodeposition painting method. For example, firstly, the metal sleeve 72m is washed. Then, the metal sleeve 72m is immersed in an electrodeposition bath in which an electrodeposition solution that contains an electrodeposition resin is stored. In the electrodeposition bath, an electrode is installed. When the insulative resin layer is formed by means of cationic electrodeposition, an electric current is allowed to flow between the metal sleeve 72m and the anode, where the metal sleeve 72m serves as the cathode and the electrode installed in the electrodeposition bath serves as the anode, so that the electrodeposition resin is deposited on the outer perimeter surface of the metal sleeve 72m, whereby the insulative resin layer is formed. When the insulative resin layer is formed by means of anionic electrodeposition, an electric current is allowed to flow, where the metal sleeve 72m serves as the anode and the electrode installed in the electrodeposition bath serves as the cathode, whereby the insulative resin layer is formed. Thereafter, the washing step and the baking step are performed, whereby an organic insulating layer 13 is formed. The electrodeposition resin used may be, for example, a polyimide resin, an epoxy resin, an acrylic resin, a melamine resin, a urethane resin, or a mixture thereof. The organic insulating layer 13 can be formed by forming an insulative resin layer using a various coating method other than electrodeposition and, when necessary, curing the insulative resin layer. The organic insulating layer 13 has a high surface flattening effect and can prevent scars or the like in the surface of the metal sleeve 72m, for example, being reflected in the surface shape of the aluminum alloy layer 18.

Then, as shown in FIG. 15(c), an inorganic underlayer 14 is formed on the organic insulating layer 13. For example, a SiO$_2$ layer 14 which has a thickness of about 100 nm is formed. The present invention is not limited to the SiO$_2$ layer. For example, a Ta$_2$O$_5$ layer may be formed instead.

Then, as shown in FIG. 15(d), the buffer layer 16 and the aluminum alloy layer 18 are continuously formed. The same target is used for formation of the buffer layer 16 and the aluminum alloy layer 18. Therefore, the proportion of aluminum and the metal element M is constant in the buffer layer 16 and the aluminum alloy layer 18. The thickness of the buffer layer 16 is, for example, about 100 nm. The thickness of the aluminum alloy layer 18 is about 1 μm. The process continuing from formation of the inorganic underlayer 14 to formation of the aluminum alloy layer 18 is carried out by a thin film deposition method (e.g., sputtering). The entirety of this process is preferably carried out in the same chamber.

Then, anodization and etching are alternately and repeatedly performed on a surface of the aluminum alloy layer so as to form a porous alumina layer 20 which has a plurality of minute recessed portions, whereby a mold 100a is obtained as shown in FIG. 15(e).

Figure 16:
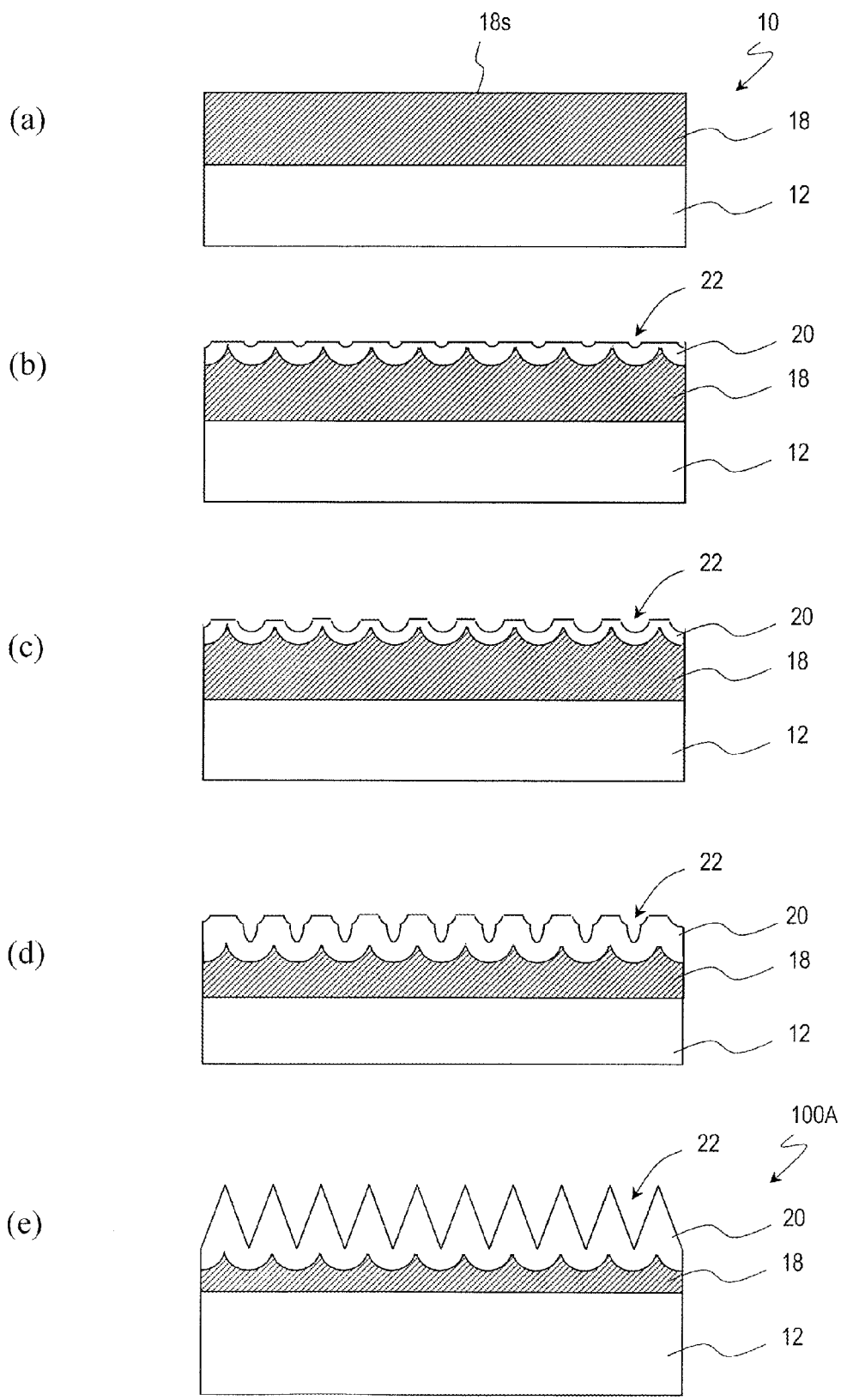
FIG. 16 (a) to (e) are diagrams showing the steps of a method for manufacturing a mold which has a porous alumina layer.

Next, a method for forming the porous alumina layer 20 is described with reference to FIG. 16. In FIG. 16, as the mold base 10 shown, the aluminum alloy layer 18 is directly provided on a support 12.

First, the mold base 10 is provided as shown in FIG. 16(a). The mold base 10 includes a metal base, an organic insulating layer 13 provided on the metal base, and an aluminum alloy layer 18 deposited on the organic insulating layer 13.

Then, a surface of the mold base 10 (a surface 18s of the aluminum alloy layer 18) is anodized to form a porous alumina layer 20 which has a plurality of minute recessed portions 22 (micropores) as shown in FIG. 16(b). The porous alumina layer 20 includes a porous layer which has the minute recessed portions 22 and a barrier layer. The porous alumina layer 20 may be formed by, for example, anodizing the surface 18s in an acidic electrolytic solution. The electrolytic solution used in the step of forming the porous alumina layer 20 may be, for example, an aqueous solution which contains an acid selected from the group consisting of oxalic acid, tartaric acid, phosphoric acid, chromic acid, citric acid, and malic acid. By modifying the anodization conditions (e.g., the type of the electrolytic solution, the applied voltage), the interpore distance, the depth of the micropores, the shape of the micropores, etc., can be adjusted. Note that the thickness of the porous alumina layer may be changed when necessary. The aluminum alloy layer 18 may be entirely anodized.

Then, the porous alumina layer 20 is brought into contact with an alumina etchant such that a predetermined amount is etched away, whereby the pore diameter of the minute recessed portions 22 is increased as shown in FIG. 16(c). Here, wet etching may be employed such that the pore wall and the barrier layer can be generally isotropically etched. By modifying the type and concentration of the etching solution and the etching duration, the etching amount (i.e., the size and depth of the minute recessed portions 22) can be controlled. The etching solution used may be, for example, an aqueous solution of 10 mass % phosphoric acid or organic acid, such as formic acid, acetic acid, citric acid, or the like, or a chromium-phosphoric acid mixture solution.

Then, the aluminum alloy layer 18 is again partially anodized such that the minute recessed portions 22 are grown in the depth direction and the thickness of the porous alumina layer 20 is increased as shown in FIG. 16(d). Here, the growth of the minute recessed portions 22 starts at the bottoms of the previously-formed minute recessed portions 22, and accordingly, the lateral surfaces of the minute recessed portions 22 have stepped shapes.

Thereafter, when necessary, the porous alumina layer 20 may be brought into contact with an alumina etchant to be etched such that the pore diameter of the minute recessed portions 22 is further increased. The etching solution used in this step may preferably be the above-described etching solution. Practically, the same etching bath may be used.

In this way, by repeating the anodization step and the etching step as described above, the moth-eye mold 100A that includes the porous alumina layer 20 which has a desired uneven shape is obtained as shown in FIG. 16(e). By modifying the conditions, the duration, and the number of cycles of the anodization step and the etching step, the lateral surfaces of the minute recessed portions 22 can have a stepped surface or can have a smooth curved surface or slope surface.

Next, a method for producing an antireflection film with the use of a roll-shaped moth-eye mold of an embodiment of the present invention is described. The roll-shaped mold has such an advantageous that, by spinning the roll-shaped mold around the axis, the surface structure of the mold can be continuously transferred to a work (an object which has a surface over which an antireflection film is to be formed).

The antireflection film production method of an embodiment of the present invention includes the steps of: providing the above-described mold; providing a work; irradiating a photocurable resin interposed between the mold and a surface of the work with light, thereby curing the photocurable resin; and peeling off the mold from an antireflection film which is formed by the cured photocurable resin.

When a roll-shaped film is used as the work, an antireflection film can be produced by a roll-to-roll method. It is preferred that the film includes a base film and a hard coat layer provided on the base film, and the antireflection film is provided on the hard coat layer. As the base film, for example, a TAG (triacetyl cellulose) film may be preferably used. As the hard coat layer, for example, an acrylic hard coat material may be used.

Figure 17:
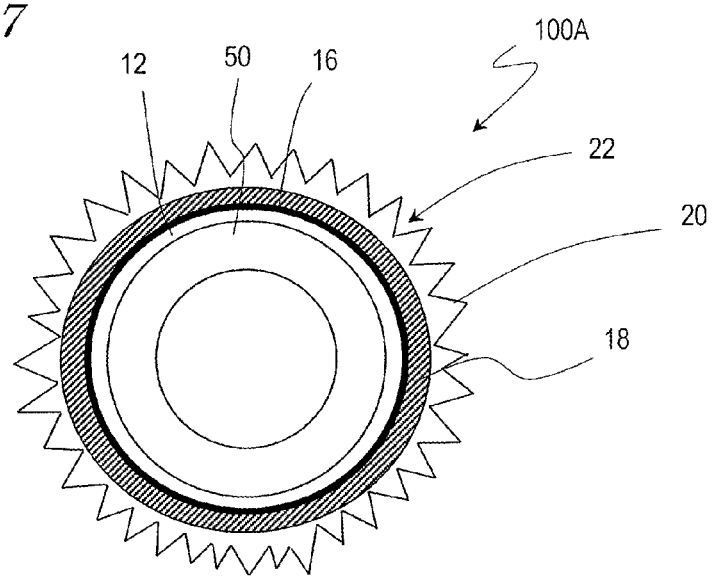
FIG. 17 A cross-sectional view schematically showing the configuration of a mold 100A which has a metal sleeve.

The metal sleeve 72m of the mold 100a shown in FIG. 15(e) readily deforms, and therefore, it is difficult to use the mold 100a as it is. In view of such, a core member 50 is inserted inside the metal sleeve 72m of the mold 100a as shown in FIG. 17, whereby a mold 100A is obtained which can be used in an antireflection film production method according to a roll-to-roll method. Note that the mold 100A shown in FIG. 17 has a buffer layer 16 which is provided on the support 12.

Figure 18:
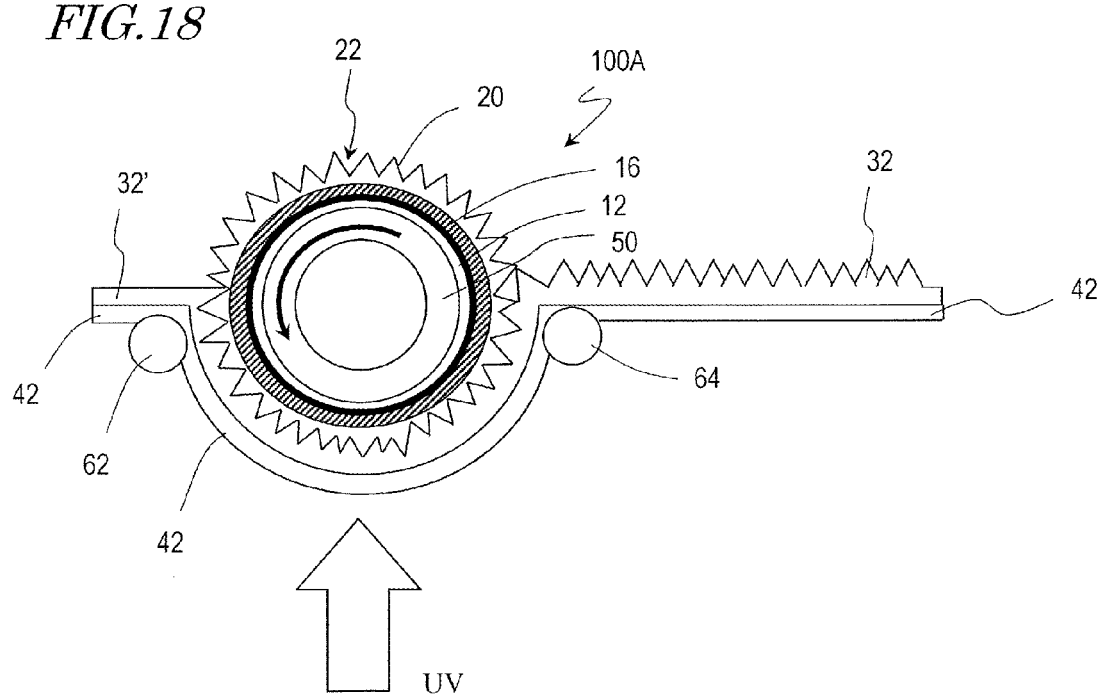
FIG. 18 A schematic diagram for illustrating a method for producing an antireflection film with the use of a mold of an embodiment of the present invention.

Next, an antireflection film production method with the use of a mold of an embodiment of the present invention is described with reference to FIG. 18. FIG. 18 is a schematic cross-sectional view for illustrating a method for producing an antireflection film according to a roll-to-roll method.

Firstly, a moth-eye mold 100A in the form of a roll, which is shown in FIG. 17, is provided.

Then, as shown in FIG. 18, a work 42 over which a UV-curable resin 32' is applied on its surface is maintained pressed against the moth-eye mold 100A, and the UV-curable resin 32' is irradiated with ultraviolet (UV) light such that the UV-curable resin 32' is cured. The UV-curable resin 32' used may be, for example, an acrylic resin. The work 42 may be, for example, a TAC (triacetyl cellulose) film. The work 42 is fed from an unshown feeder roller, and thereafter, the UV-curable resin 32' is applied over the surface of the work 42 using, for example, a slit coater or the like. The work 42 is supported by supporting rollers 62 and 64 as shown in FIG. 18. The supporting rollers 62 and 64 have rotation mechanisms for carrying the work 42. The moth-eye mold 100A in the form of a roll is rotated at a rotation speed corresponding to the carrying speed of the work 42 in a direction indicated by the arrow in FIG. 18.

Thereafter, the moth-eye mold 100A is separated from the work 42, whereby a cured material layer 32 to which an uneven structure of the moth-eye mold 100A (inverted moth-eye structure) is transferred is formed on the surface of the work 42. The work 42 which has the cured material layer 32 formed on the surface is wound up by an unshown winding roller.

In the example described hereinabove, a metal sleeve is used as the metal base, although an aluminum base in a bulk form may be used instead of the metal sleeve.

Next, a method for manufacturing a roll-shaped mold base which is for use in formation of a cylindrical (roll-shaped) moth-eye mold is described with reference to FIG. 19 and FIG. 20.

A cylindrical mold base manufacturing method according to an embodiment of the present invention includes the step of arranging a cylindrical base in a film formation chamber so as to be at least capable of rotating around its own cylindrical axis, and the step of depositing an aluminum alloy layer over an outer perimeter surface of the base according to a DC magnetron sputtering method, using a target that contains aluminum and a non-aluminum metal element, in an atmosphere in the film formation chamber in which a nitrogen gas is mixed, while the base is kept rotating around its own cylindrical axis.

Although, as a matter of course, the cylindrical mold base can be manufactured on a one-by-one basis, manufacturing a plurality of mold bases at one time is preferred from the viewpoint of mass productivity. FIGS. 19(a) and 19(b) are schematic diagrams for illustrating a method of manufacturing a plurality of cylindrical mold bases.

FIGS. 19(a) and 19(b) schematically show an arrangement of cylindrical bases (e.g., the metal sleeve 72m described above) in a film formation chamber (also referred to as "chamber"; not shown) in which sputtering is to be performed.

As shown in FIG. 19(b), nine cylindrical bases are arranged on a rotatable stage ST along a circumferential direction with constant intervals. The inside of the chamber is controlled to a predetermined vacuum degree, and a sputtering gas (Ar gas) and a nitrogen gas each can be supplied into the chamber at a predetermined flow rate.

The cylindrical bases 72m are placed on sub-stages SST which are rotatable independently or in synchronization with one another. Therefore, the cylindrical bases 72m are arranged so as to be capable of rotating around their own cylindrical axes on the sub-stages SST while orbiting along the circumferential direction of the stage ST.

The sputtering apparatus is, for example, a carousel sputtering apparatus and includes, for example, four targets T1, T2, T3, and T4 as shown in FIG. 19(b). Materials can be supplied into the film formation chamber by opening and closing shutters S1, S2, S3, and S4. As for the above-described inorganic layers, formation of the $SiO_2$ layer and the $Ta_xO_y$ layer is realized by RF sputtering, and formation of the Al—Ti layer is realized by DC sputtering. Note that, in formation of the Al—Ti layer, the inside of the film formation chamber is an atmosphere which contains a nitrogen gas at a predetermined volume fraction so that a nitrogen-containing aluminum alloy layer is formed. The composition of the targets is, for example, Al: 99.5 mass % and Ti: 0.5 mass %.

The directions of the rotation and the orbital movement of the cylindrical bases 72*m* are preferably identical (here, clockwise), and the rotation speed and the orbital movement speed are preferably slow.

As shown in FIG. 19(a), there is no necessity to occupy all of the sub-stages SST by the cylindrical bases 72*m*. Note that, however, as illustrated in FIG. 19(a), shield members are preferably provided at both sides of a cylindrical base 72*m* which is to be a final product. The shield members are arranged such that the cylindrical bases 72*m* are uniformly exposed to the materials supplied from the targets. The shield members may be a cylindrical base which is not to be used (dummy 72*d*). When all of the sub-stages SST are occupied by the cylindrical bases 72*m*, two cylindrical bases 72*m* which are adjacent to each of the cylindrical bases 72*m* function as the shield members.

The results of examinations as to specific film formation conditions are described with reference to FIGS. 20(a) to 20(d).

Figures 20, 21:
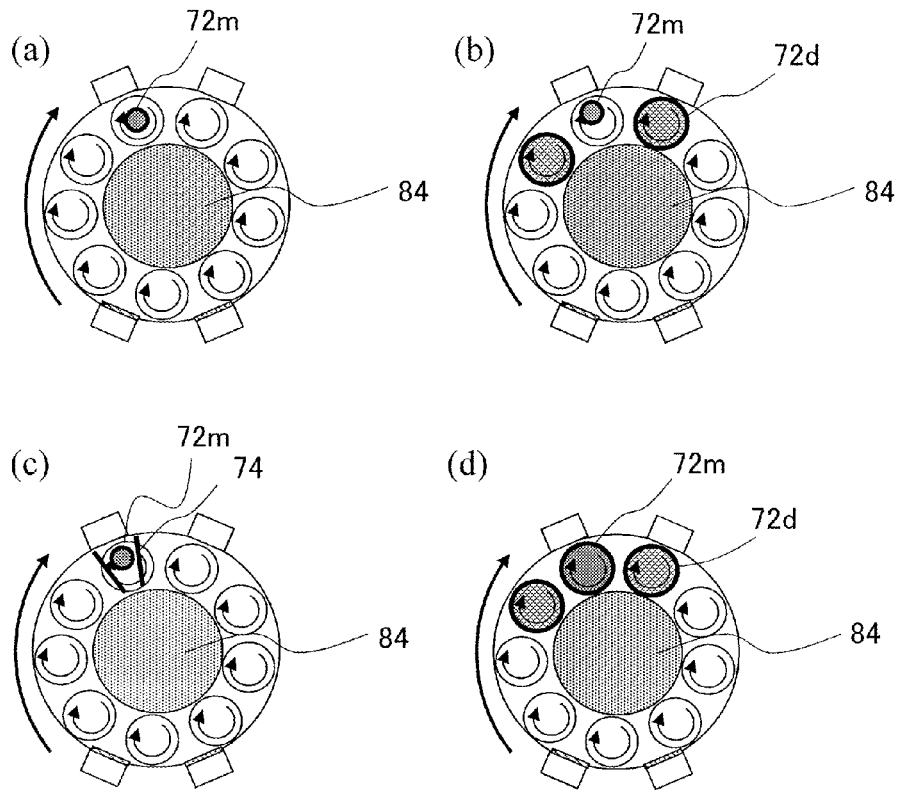
FIG. 20 (a) to (d) are diagrams schematically showing arrangements of the cylindrical bases used in experiments.
FIG. 21 A table that shows the results of examinations as to the effects of the arrangements of cylindrical bases on the film quality of the aluminum alloy layer.

Although the carousel sputtering apparatus used in experiments is capable of housing twelve cylindrical bases 72*m* which have a diameter of 300 mm and a length of about 1600 mm, FIG. 20 shows the case of nine cylindrical bases for the sake of simplicity. The sub-stages SST are arranged such that when the cylindrical bases 72*m* have a diameter of 300 mm, the shortest distance between the targets T1 to T4 and the cylindrical bases 72*m* is 7 cm. The rotation period of the cylindrical bases 72*m* is about 20 seconds. The orbital movement period of the cylindrical bases 72*m* is about 100 seconds.

FIGS. 20(a) to 20(d) schematically show arrangements of the cylindrical bases 72*m* used in the experiments.

In FIG. 20(a), a cylindrical base 72*m* which has a diameter of 150 mm is placed at the center of the sub-stage SST with no shield members at both sides of the cylindrical base. This is referred to as "arrangement a".

In FIG. 20(b), a cylindrical base 72*m* which has a diameter of 150 mm is placed so as to rotate at a position which is 4.5 cm closer to the targets than the center of the sub-stage SST, and dummy cylindrical bases 72*d* (or simply "dummies 72*d*") which have a diameter of 300 mm are placed as the shield members at both sides of the cylindrical base 72*m*. This is referred to as "arrangement b".

In FIG. 20(c), a cylindrical base 72*m* which has a diameter of 150 mm is placed so as to rotate at a position which is 4.5 cm closer to the targets than the center of the sub-stage SST as in FIG. 20(b), and instead of the dummies 72*d* of FIG. 20(b), shield plates 74 are placed at positions which are closer to the surfaces of the adjacent dummies 72*d*. This is referred to as "arrangement c".

In FIG. 20(d), a cylindrical base 72*m* which has a diameter of 300 mm is placed at the center of the sub-stage SST, and dummies 72*d* which have a diameter of 300 mm are placed at both sides of the cylindrical base 72*m*. This is referred to as "arrangement d".

In the experiment which will be described below, the cylindrical base 72*m* used was an aluminum pipe. (The aluminum pipe was made of a material from the 6000 series. The thickness of the pipe was 5 to 25 mm).

First, a $SiO_2$ layer having a thickness of 15 nm to 70 nm was formed on the surface of the cylindrical bases 72*m*, and an aluminum alloy layer (Al—Ti layer) was formed on the $SiO_2$ layer. In formation of the aluminum alloy layer, the flow rate of the nitrogen gas supplied into the film formation chamber was varied so that a nitrogen-free aluminum alloy layer (comparative example) and nitrogen-containing aluminum alloy layers of different nitrogen contents were formed. The target used was such that Al: 99.5 mass % and Ti: 0.5 mass %.

Mold bases including the resultant aluminum alloy layers were visually evaluated and evaluated as to the etching property with phosphoric acid, the structure of the moth-eye mold, and the electrical resistance.

Firstly, the results of examinations as to the effects of arrangements a to d that have been described with reference to FIG. 20 on the film quality of the aluminum alloy layer are shown in FIG. 21. Among samples A to H shown in FIG. 21, sample A was formed with arrangement a, sample B was formed with arrangement b, samples C and D were formed with arrangement c, and samples E to H were formed with arrangement d. Also, the effects of presence/absence of supply of the nitrogen gas (nitrogen gas flow rate: 10 sccm) and the arrangement of the shield members (dummies 72*d*, shield plates 74) were examined. Further, moth-eye molds were manufactured, and the light scatterability of the surfaces of the moth-eye molds was evaluated. The light scatterability was evaluated using a colorimeter/color difference meter (CR-331 manufactured by Konica Minolta, Inc.) Specifically, collimated light is provided in a direction inclined by 45° with respect to the normal direction of the moth-eye mold surface, and the light scatterability was evaluated based on the Y value of light incident on a detector positioned in the normal direction of the moth-eye mold surface. Larger Y values mean higher light scatterability. Note that the results of sample A (arrangement a) are not shown in FIG. 21. This is because sample A had poor specularity in the aluminum alloy layer surface so that the reflectance to light of 400 nm to 700 nm was approximately not more than 20%, which was a very low value. Sample A looked opaque to human eye. Therefore, sample A was determined to be ineligible before manufacture of a moth-eye mold.

The manufacture conditions for the moth-eye molds are as follows:

Anodization Step Oxalic acid aqueous solution: 0.025 mol/L, Temperature: 10° C., Forming voltage: 45 V, Anodization duration (electric conduction duration): 3 minutes and 30 seconds.

Etching Step: Phosphoric acid aqueous solution: 1 mol/L, Temperature: 30° C., Etching duration: 20 minutes.

The above-described anodization step and etching step were alternately repeated four times, and thereafter, the anodization step was carried out once at the end.

Referring to FIG. 21, as seen from the comparison between sample A and sample B, the light scatterability of the surface of the aluminum alloy layer can be reduced by placing shield members (dummies) at both sides of a cylindrical base (which is to be a final product). Further, as seen from the comparison between sample B and samples C and D, the effect of reducing the light scatterability of the surface improves as the distance between the base and the shield members decreases.

Further, as seen from the comparison between samples E and F and samples G and H, supply of nitrogen reduces the light scatterability of the surface. Samples C and D and samples G and H, which were formed with supply of nitrogen, not only have small Y values, but also have small variations in that value (the variation between sample C and sample D and the variation between sample G and sample H), as compared with samples E and F. That is, it can be seen that supply of nitrogen enables reduction of manufacture variations.

Next, the results of examinations as to the preferred range of the amount of supplied nitrogen are described.

The amount of supplied nitrogen was controlled by controlling the flow rate of the nitrogen gas supplied into the film formation chamber in the film formation step with the use of the above-described sputtering apparatus. The content of nitrogen in the aluminum alloy layer was controlled by adjusting the flow rate of the nitrogen gas to 0 sccm (no nitrogen), 5 sccm, 10 sccm, 15 sccm, and 20 sccm in the sputtering gas (flow rate: 440 sccm), while the film formation conditions for the aluminum alloy layer were the same as those described above and the vacuum degree was 0.4 Pa.

Figure 22:
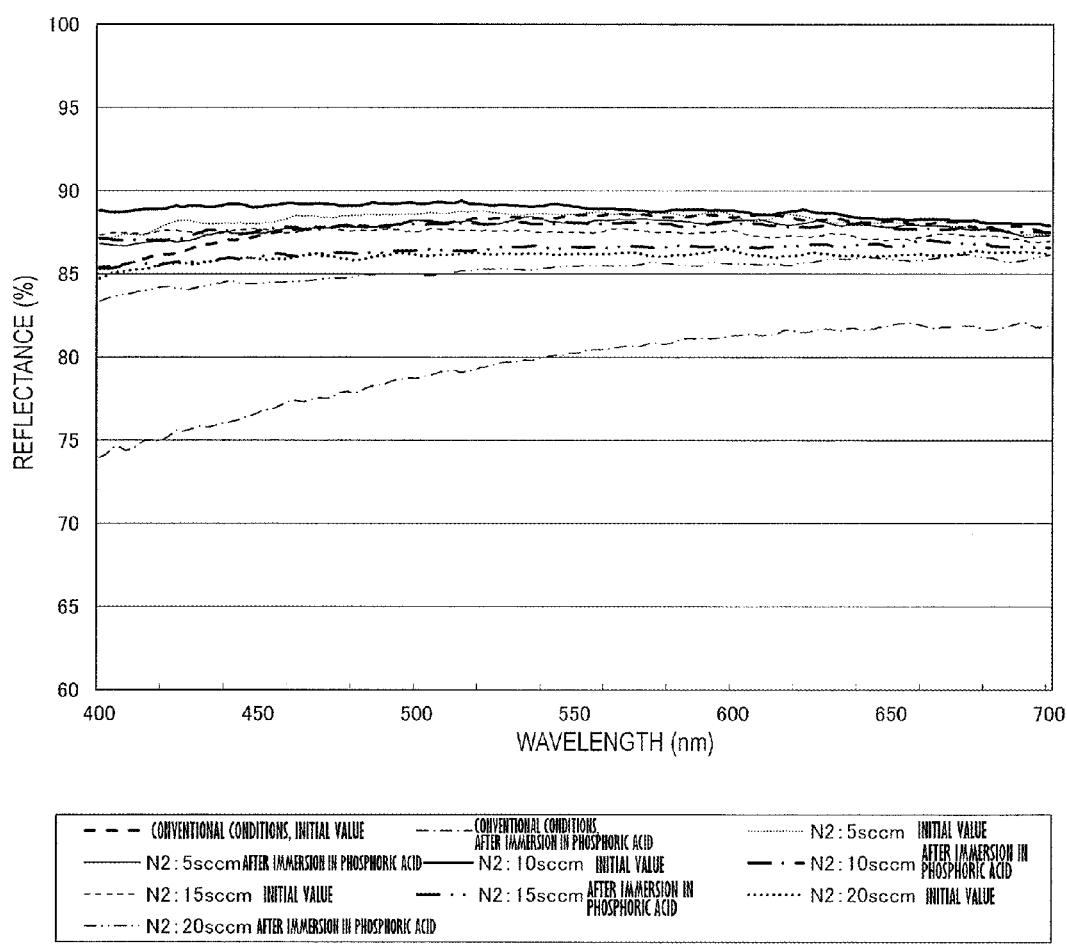
FIG. 22 A graph that shows the results of measurement of the spectral reflectance of a surface of aluminum alloy layers (initial values) and the spectral reflectance of aluminum alloy layers after immersion of the aluminum alloy layers in a 1 mol/L phosphoric acid aqueous solution for 100 minutes.

The spectral reflectances of the surfaces of the aluminum alloy layers (as-grown: initial values) and the spectral reflectances of the surfaces of the aluminum alloy layers immersed in a 1 mol/L phosphoric acid aqueous solution for 100 minutes were measured. The results of the measurement are shown in FIG. 22. The measurement wavelength range was 400 nm to 700 nm.

As clearly seen from FIG. 22, the sample of the comparative example which was formed with no nitrogen gas mixed in the sputtering gas exhibited greatly decreased reflectance because of immersion in the phosphoric acid aqueous solution. That is, because of the phosphoric acid aqueous solution, the surface of the aluminum alloy layer was etched so that the specularity greatly decreased.

On the other hand, it can be seen that the aluminum alloy layers which were formed with the nitrogen gas mixed in the sputtering gas still exhibited high reflectances over the almost entire measurement wavelength range even after immersion in the phosphoric acid aqueous solution. Particularly, the aluminum alloy layers still exhibited high reflectances of not less than 85% over the almost entire measurement wavelength range, except for the aluminum alloy layer formed with the nitrogen gas mixed at the flow rate of 20 sccm. Among others, the aluminum alloy layers formed with the nitrogen flow rate of 10 sccm and 15 sccm exhibited high reflectances of not less than 86% both in the initial state and after immersion in the phosphoric acid aqueous solution.

Next, the decrease in size of crystal grains that form the aluminum alloy layer and the improvement in uniformity of the crystal grains, which were achieved by supply of nitrogen, are described with reference to FIGS. 23(a) to 23(c) and FIG. 24.

Figure 23:
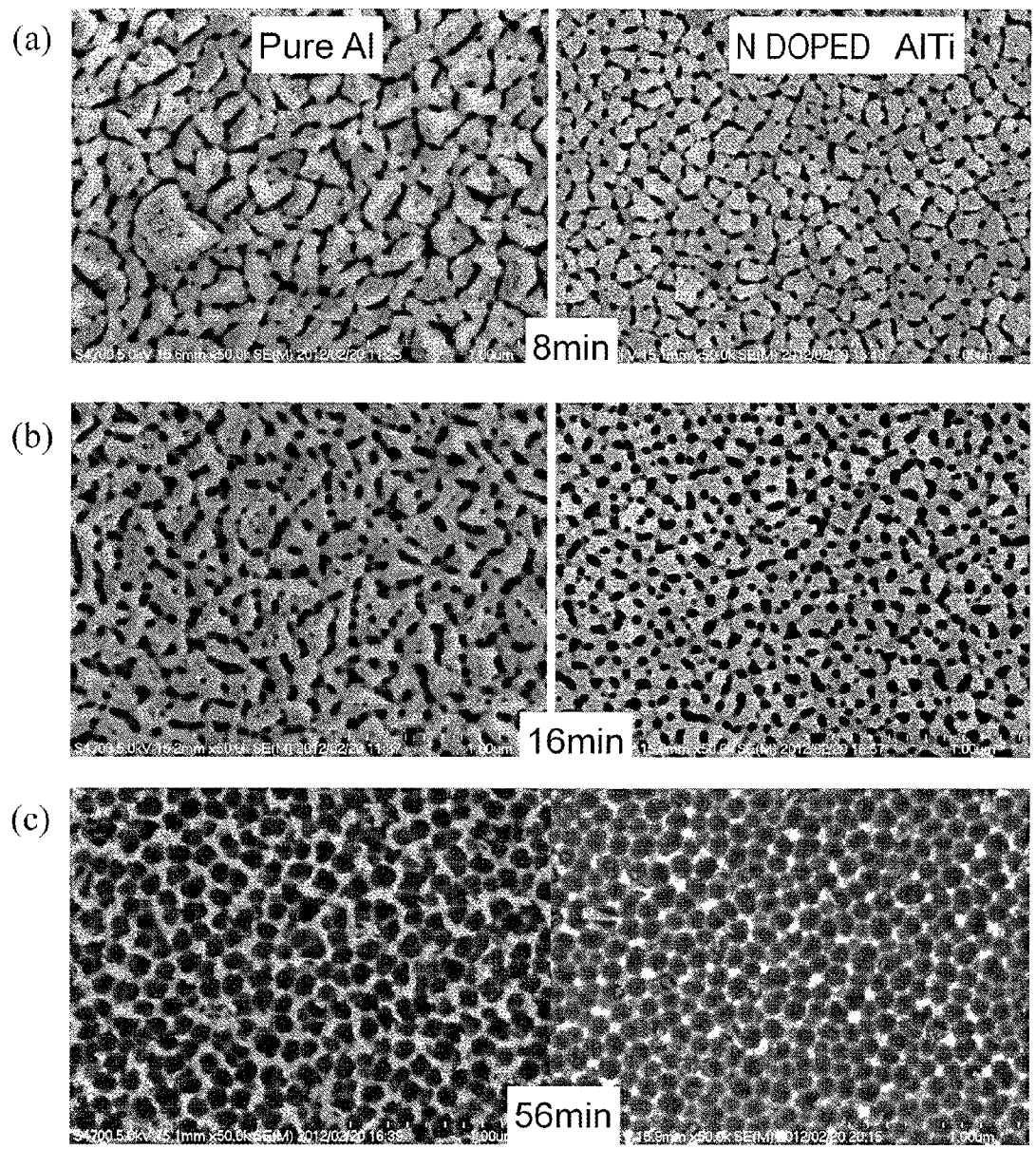
FIG. 23 (a) to (c) are SEM images of a pure aluminum layer and an aluminum alloy layer formed with a nitrogen gas being mixed at a flow rate of 10 sccm, which underwent one cycle of the anodization step and immersion in a phosphoric acid aqueous solution, showing that the phosphoric acid aqueous solution gradually enlarges the minute recessed portions formed by anodization.
Figure 24:
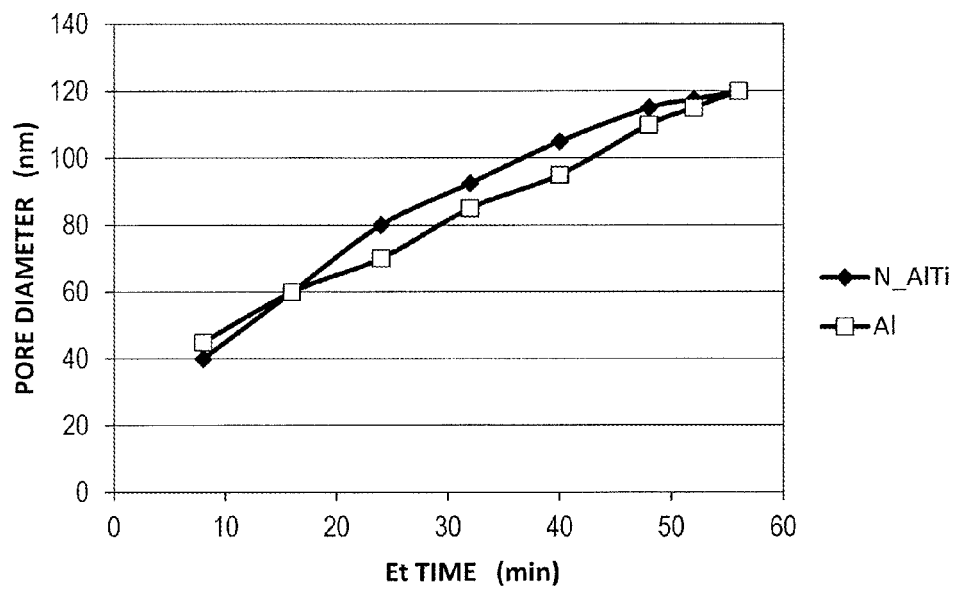
FIG. 24 A graph that shows the relationship for the samples of FIG. 23 between the duration of immersion in the phosphoric acid aqueous solution (Et time) and the diameter of recessed portions determined based on the SEM image (pore diameter; corresponding to $D_p$ which will be described later).

FIGS. 23(a) to 23(c) are SEM images of a pure aluminum layer (target purity: not less than 99.99 mass %, no nitrogen gas mixed) and an aluminum alloy layer formed with the nitrogen gas mixed at the flow rate of 10 sccm (target alloy: aluminum 99.5 mass %, Ti 0.5 mass %) which underwent one cycle of the anodization step and thereafter immersion in a phosphoric acid aqueous solution, showing that minute recessed portions formed by anodization gradually enlarge due to the phosphoric acid aqueous solution. FIG. 24 is a graph showing the relationship between the immersion duration (Et time) in the phosphoric acid aqueous solution and the diameter of the recessed portions determined from the SEM images (pore diameter; corresponding to $D_p$ described above). The anodization step and the etching step with the phosphoric acid aqueous solution were carried out under the same conditions as those described above. As seen from FIG. 24, even when nitrogen is contained in the aluminum alloy, the etching rate does not greatly vary.

As seen from the SEM images of FIGS. 23(a) to 23(c), the size of crystal grains that form the nitrogen-containing aluminum alloy layer is smaller than the size of crystal grains that form the pure aluminum layer, and the crystal grains of the nitrogen-containing aluminum alloy layer has high uniformity. Formation of recessed portions (micropores) by anodization advances more readily at the grain boundaries (valleys), and the etching also advances more readily at the valleys. The nitrogen-containing aluminum alloy layer has small crystal grains, and the uniformity of the crystal grains is high. Therefore, the valleys are small (shallow) so that the etching advances uniformly. As a result, it is concluded that a plurality of recessed portions that form the inverted moth-eye structure are formed very densely.

Figure 25:
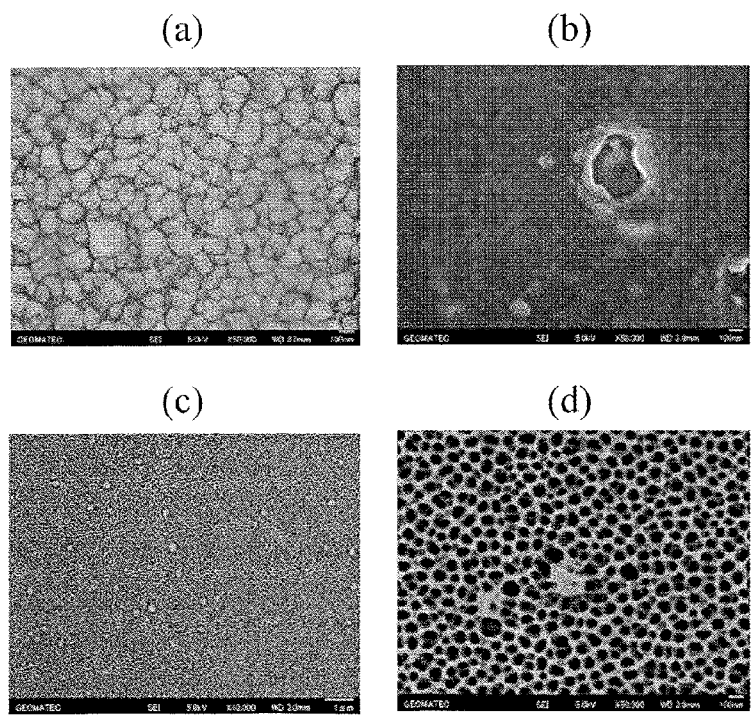
FIG. 25 (a) is a surface SEM image of an aluminum alloy layer of a comparative example formed without supply of nitrogen. (b) is a surface SEM image of the aluminum alloy layer after immersion in a phosphoric acid aqueous solution (1 mol/L) for 100 minutes. (c) and (d) are ×10000 and ×50000 surface SEM images after formation of a moth-eye mold.
Figure 26:
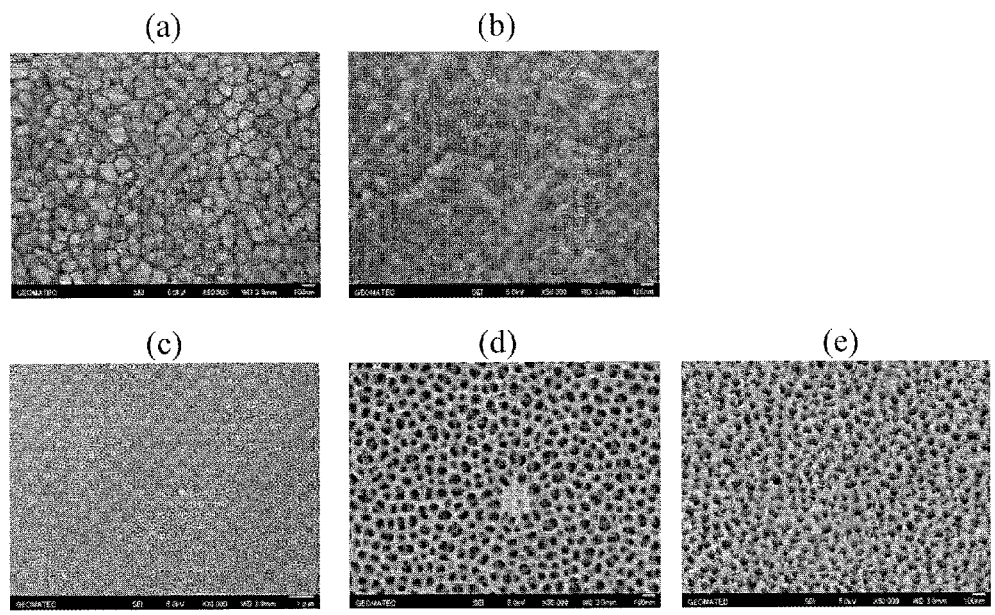
FIG. 26 (a) is a surface SEM image of an aluminum alloy layer formed with a nitrogen gas supplied at 5 sccm during film formation. (b) is a surface SEM image of the aluminum alloy layer after immersion in a phosphoric acid aqueous solution (1 mol/L) for 100 minutes. (c) and (d) are ×10000 and ×50000 surface SEM images after formation of a moth-eye mold. (e) is a cross-sectional SEM image viewed in 45° direction.
Figure 27:
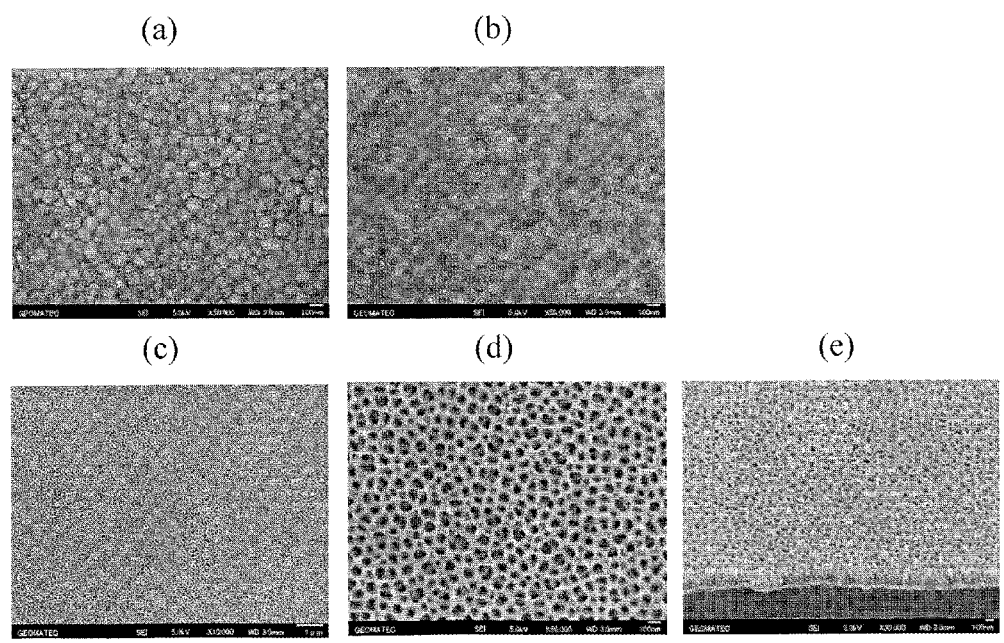
FIG. 27 (a) is a surface SEM image of an aluminum alloy layer formed with a nitrogen gas supplied at 10 sccm during film formation. (b) is a surface SEM image of the aluminum alloy layer after immersion in a phosphoric acid aqueous solution (1 mol/L) for 100 minutes. (c) and (d) are ×10000 and ×50000 surface SEM images after formation of a moth-eye mold. (e) is a cross-sectional SEM image viewed in 45° direction.
Figure 28:
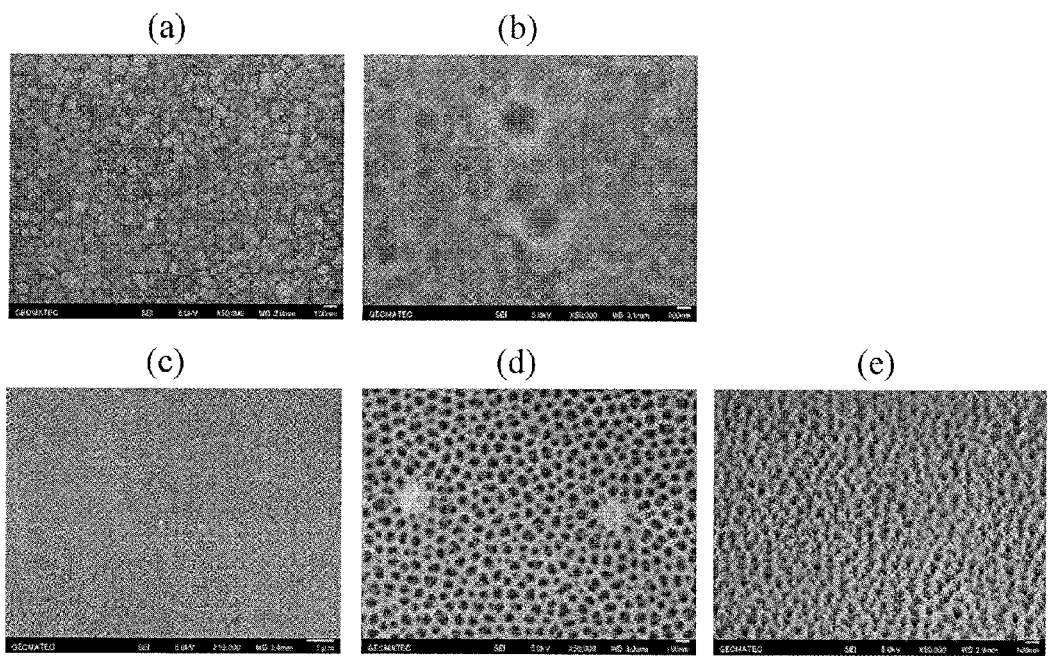
FIG. 28 (a) is a surface SEM image of an aluminum alloy layer formed with a nitrogen gas supplied at 15 sccm during film formation. (b) is a surface SEM image of the aluminum alloy layer after immersion in a phosphoric acid aqueous solution (1 mol/L) for 100 minutes. (c) and (d) are ×10000 and ×50000 surface SEM images after formation of a moth-eye mold. (e) is a cross-sectional SEM image viewed in 45° direction.
Figure 29:
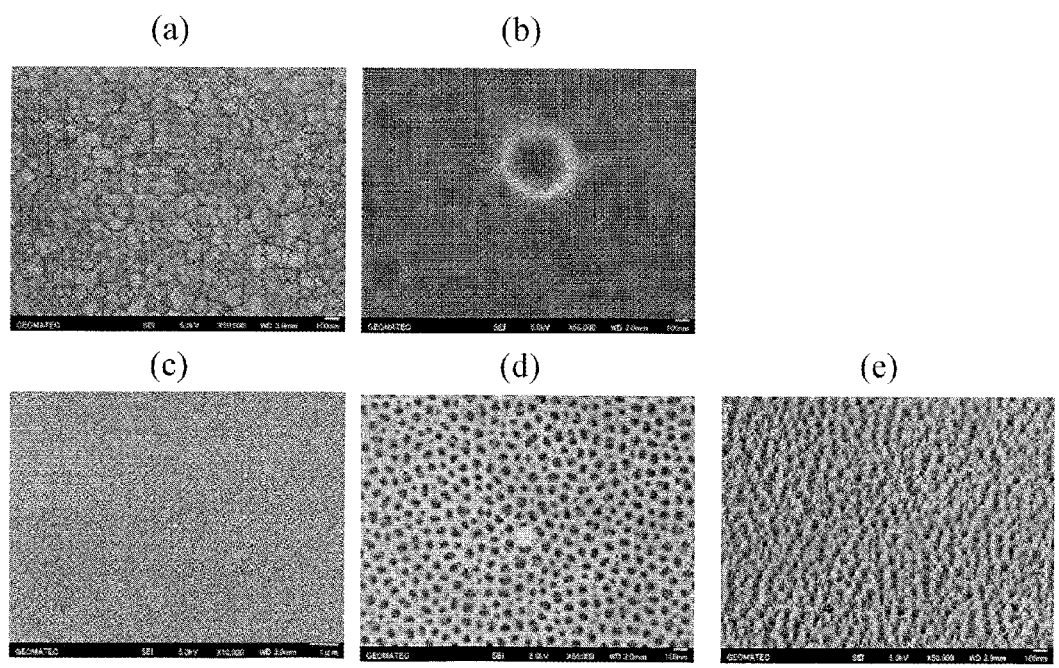
FIG. 29 (a) is a surface SEM image of an aluminum alloy layer formed with a nitrogen gas supplied at 20 sccm during film formation. (b) is a surface SEM image of the aluminum alloy layer after immersion in a phosphoric acid aqueous solution (1 mol/L) for 100 minutes. (c) and (d) are ×10000 and ×50000 surface SEM images after formation of a moth-eye mold. (e) is a cross-sectional SEM image viewed in 45° direction.

Next, moth-eye molds were produced through the above-described process, and the surfaces of resultant porous alumina layers were observed using SEM. In FIG. 25 through FIG. 29, (a) is a surface SEM image of the aluminum alloy layer in the initial state, (b) is a surface SEM image after immersion in a phosphoric acid aqueous solution (1 mol/L) for 100 minutes, (c) and (d) are ×10000 and ×50000 surface SEM images after formation of a moth-eye mold, and (e) is a cross-sectional SEM image viewed in 45° direction. FIG. 25 shows SEM images of an aluminum alloy layer of a comparative example formed without supply of nitrogen. FIG. 26 shows SEM images of an aluminum alloy layer with nitrogen supplied at 5 sccm during film formation. FIG. 27 shows SEM images of an aluminum alloy layer with nitrogen supplied at 10 sccm during film formation. FIG. 28 shows SEM images of an aluminum alloy layer with nitrogen supplied at 15 sccm during film formation. FIG. 29 shows SEM images of an aluminum alloy layer with nitrogen supplied at 20 sccm during film formation.

The initial surface roughness of the aluminum alloy layers shown in part (a) of FIG. 25 through FIG. 29 was measured using AFM. When no nitrogen mixed or the nitrogen flow rate was 5 sccm, 10 sccm, 15 sccm, and 20 sccm, the average surface roughness Ra was 5.527 nm, 5.102 nm, 3.145 nm, 2.582 nm, and 3.012 nm, respectively, and the maximum surface roughness Rmax was 95.48 nm, 57.13 nm, 43.59 nm, 32.52 nm, and 40.16 nm, respectively. It can also be seen from this that, when the nitrogen flow rate is 10 sccm to 15 sccm, an aluminum alloy layer can be formed which has small surface roughness and high specularity.

As clearly seen from the comparison of parts (c) and (d) of FIG. 25 and parts (c) through (e) of FIG. 26 through FIG. 29, the recessed portions formed in the porous alumina layers shown in parts (c) through (e) of FIG. 26 and FIG. 27 are uniform and dense.

Next, the composition of porous alumina layers formed using aluminum alloy layers which have different nitrogen contents is described with reference to FIG. 30. The porous alumina layers were formed through the same process as that previously described with regard to the above-described moth-eye mold manufacturing method. Here, the composition of porous alumina layers formed using aluminum alloy layers formed under the same conditions as those employed for the aluminum alloy layers whose composition analysis results are shown in FIG. 13 was analyzed using ESCA in the same way as that previously described. In consideration of the distribution along the thickness direction of the composition, the composition analysis was performed while etching was carried out using an etching gun of the ESCA (Et (sec) in the graph). In the measurement, a photoelectron spectrometer JPS-9000MC manufactured by JEOL Ltd. was used.

FIG. 30 shows the results of the composition analysis of the porous alumina layers (without nitrogen, the nitrogen flow rate: 10 sccm, 15 sccm, 20 sccm).

It can be inferred from the results which were obtained when the etching duration was 180 seconds that the aluminum alloy layer underlying the porous alumina layer was exposed. Thus, see the results which were obtained when the etching duration was 10 seconds to 120 seconds.

As seen from FIG. 30, the nitrogen content of a porous alumina layer formed using a nitrogen-containing aluminum alloy layer (nitrogen flow rate during film formation: 10 sccm) was not less than 0.5 mass % and not more than 1.1 mass %, the nitrogen content of a porous alumina layer formed using a nitrogen-containing aluminum alloy layer (nitrogen flow rate during film formation: 15 sccm) was not less than 0.7 mass % and not more than 1.4 mass %, and the nitrogen content of a porous alumina layer formed using a nitrogen-containing aluminum alloy layer (nitrogen flow rate during film formation: 20 sccm) was not less than 0.8 mass % and not more than 1.7 mass %. That is, it can be seen that a porous alumina layer formed using a nitrogen-containing aluminum alloy layer also contains nitrogen, and the nitrogen content of the porous alumina layer is not less than 0.5 mass % and not more than 1.7 mass %. Particularly, the nitrogen content of a porous alumina layer formed using an aluminum alloy layer which has a small surface roughness (nitrogen flow rate during film formation: 10 sccm to 15 sccm) is not less than 0.5 mass % and not more than 1.4 mass %.

In an antireflection film produced using a moth-eye mold which includes the thus-obtained porous alumina layer, as seen from FIG. 33(a), large raised portions which can cause scattering of light (the two-dimensional size viewed in the normal direction of the film is approximately 300 nm) are not seen, and the moth-eye structure is uniformly formed, so that the antireflection film performs an excellent antireflection function. Note that the antireflection film shown in FIG. 33(a) was produced with the use of a moth-eye mold including the porous alumina layer shown in FIG. 28.

INDUSTRIAL APPLICABILITY

The present invention relates to a mold base, a mold base manufacturing method, a mold manufacturing method, and a mold, and particularly, can be widely used for a manufacturing method of a moth-eye mold which has a porous alumina layer over its surface. The moth-eye mold can be suitably used for, for example, production of an antireflection film.

REFERENCE SIGNS LIST 1 sputtering apparatus
2 chamber
3 target
4 stage
5 insulative substrate
6 gas inlet
7 gas outlet
10 mold base
12 support
13 organic insulating layer
14 inorganic underlayer
16 buffer layer
18 aluminum alloy layer
18s surface
20 porous alumina layer
22 recessed portion
32 cured material layer
32' UV-curable resin
42 work
50 core member
62 supporting roller
70 target
72m metal sleeve (metal base)
100, 100a, 100A moth-eye mold

The invention claimed is:

1. A mold base for use in manufacture of a mold that has a porous alumina layer over its surface, comprising:
a base; and
an aluminum alloy layer provided on the base,
wherein the aluminum alloy layer contains aluminum, a non-aluminum metal element, and nitrogen.

2. The mold base of claim 1, wherein
an average grain diameter of crystal grains that form the aluminum alloy layer when viewed in a normal direction of the aluminum alloy layer is not more than 100 nm, and
a maximum surface roughness Rmax of the aluminum alloy layer is not more than 60 nm.

3. The mold base of claim 1, wherein a content of the nitrogen in the aluminum alloy layer is not less than 0.5 mass % and not more than 5.7 mass %.

4. The mold base of claim 1, wherein
an absolute value of a difference between a standard electrode potential of the metal element and a standard electrode potential of aluminum is not more than 0.64 V, and
a content of the metal element in the aluminum alloy layer is not less than 1.0 mass % and not more than 1.9 mass %.

5. The mold base of claim 1, wherein the metal element is Ti or Nd.

6. The mold base of claim 1, wherein
the base is a metal base, and
the mold base further comprises an inorganic underlayer provided between the metal base and the aluminum alloy layer.

7. The mold base of claim 6, further comprising an organic insulating layer provided between the metal base and the inorganic underlayer.

8. The mold base of claim 6, further comprising a buffer layer provided between the inorganic underlayer and the aluminum alloy layer,
wherein the buffer layer contains aluminum, the metal element, and oxygen or nitrogen.

9. The mold base of claim 6, wherein
the metal base has a cylindrical shape, and
the inorganic underlayer is provided over an outer perimeter surface of the cylindrical metal base.

10. A mold comprising:
a base; and
a porous alumina layer provided on the base,
wherein the porous alumina layer has a plurality of recessed portions whose two-dimensional size viewed in a direction normal to its surface is not less than 10 nm and less than 500 nm and contains nitrogen, the porous alumina layer having an inverted moth-eye structure over its surface; and
an aluminum alloy layer provided between the base and the porous alumina layer,
wherein the aluminum alloy layer contains aluminum, a non-aluminum metal element, and nitrogen.

11. A method for manufacturing a mold which has an inverted moth-eye structure over its surface, the inverted moth-eye structure having a plurality of recessed portions whose two-dimensional size viewed in a direction normal to its surface is not less than 10 nm and less than 500 nm, the method comprising:

(a) providing a mold base including a base; and an aluminum alloy layer provided on the base, the aluminum alloy layer containing aluminum, a non-aluminum metal element, and nitrogen;

(b) partially anodizing the aluminum alloy layer to form a porous alumina layer which has a plurality of minute recessed portions;

(c) after step (b), bringing the porous alumina layer into contact with an etching solution, thereby enlarging the plurality of minute recessed portions of the porous alumina layer; and (d) after step (c), further performing anodization to grow the plurality of minute recessed portions.

12. The method of claim 11, wherein an average grain diameter of crystal grains that form the aluminum alloy layer when viewed in a normal direction of the aluminum alloy layer is not more than 100 nm, and a maximum surface roughness Rmax of the aluminum alloy layer is not more than 60 nm.

13. The method of claim 11, wherein a content of the nitrogen in the aluminum alloy layer is not less than 0.5 mass % and not more than 5.7 mass %.

14. The method of claim 11, wherein an absolute value of a difference between a standard electrode potential of the metal element and a standard electrode potential of aluminum is not more than 0.64 V, and a content of the metal element in the aluminum alloy layer is not less than 1.0 mass % and not more than 1.9 mass %.

15. The method of claim 11, wherein the metal element is Ti or Nd.

16. The method of claim 11, wherein the base is a metal base, and the mold base further comprises an inorganic underlayer provided between the metal base and the aluminum alloy layer.

17. The method of claim 16, further comprising an organic insulating layer provided between the metal base and the inorganic underlayer.

18. The method of claim 16, further comprising a buffer layer provided between the inorganic underlayer and the aluminum alloy layer, wherein the buffer layer contains aluminum, the metal element, and oxygen or nitrogen.

19. The method of claim 16, wherein the metal base has a cylindrical shape, and the inorganic underlayer is provided over an outer perimeter surface of the cylindrical metal base.

* * * * *

UNITED STATES PATENT AND TRADEMARK OFFICE
CERTIFICATE OF CORRECTION

PATENT NO. : 9,914,243 B2
APPLICATION NO. : 14/405450
DATED : March 13, 2018
INVENTOR(S) : Akinobu Isurugi et al.

Page 1 of 1

It is certified that error appears in the above-identified patent and that said Letters Patent is hereby corrected as shown below:

On the Title Page

Item (73) should be corrected to read:
(73) Assignee: SHARP KABUSHIKI KAISHA, Osaka (JP)
GEOMATEC CO., LTD., Kanagawa (JP)

Signed and Sealed this
First Day of January, 2019

Andrei Iancu
*Director of the United States Patent and Trademark Office*